United States Patent [19]
Spencer et al.

[11] Patent Number: 5,875,087
[45] Date of Patent: *Feb. 23, 1999

[54] CIRCUIT BREAKER WITH INTEGRATED CONTROL FEATURES

[75] Inventors: George Auther Spencer, Plano; LeRoy Blanton, Garland; Robert Henry Clunn, Richardson, all of Tex.

[73] Assignee: George A. Spencer, Plano, Tex.

[*] Notice: This patent issued on a continued prosecution application filed under 37 CFR 1.53(d), and is subject to the twenty year patent term provisions of 35 U.S.C. 154(a)(2).

[21] Appl. No.: 695,076

[22] Filed: Aug. 8, 1996

[51] Int. Cl.⁶ .................................................. H02H 3/26
[52] U.S. Cl. .............................. 361/87; 361/85; 361/93
[58] Field of Search ........................... 368/85, 87, 93–98, 368/78

[56] References Cited

U.S. PATENT DOCUMENTS

| | | | |
|---|---|---|---|
| 4,316,187 | 2/1982 | Spencer | 340/664 |
| 4,685,046 | 8/1987 | Sanders | 363/89 |
| 4,949,214 | 8/1990 | Spencer | 361/95 |
| 5,038,246 | 8/1991 | Durivage, III | 361/93 |
| 5,361,184 | 11/1994 | El-Sharkawi et al. | 361/93 |
| 5,452,223 | 9/1995 | Zuercher et al. | 361/87 |

*Primary Examiner*—Sally C. Medley
*Attorney, Agent, or Firm*—Gregory M. Howison; Mark W. Handley

[57] ABSTRACT

A digitally controlled circuit breaker includes a conventional thermal circuit breaker (10) which is controlled by a solenoid (16) to override the thermal aspect thereof. The solenoid (16) is controlled by a digital processing section (20). The digital processing section (20) has a digital control module (22) with multiple profile tables associated therewith. The profile tables allow the digital control module (22) to compare a sensed current from a sensor (24) with a predetermined current value as a function of time and to generate the control signal for the solenoid (16) if the sensed current exceeds that in the profile. The profiles can optionally be downloaded to the module (22) through a serial communication port (36). The digital control module (22) is also operable to sense the voltage of the circuit breaker to determine zero crossing points and phase angle, which phase angle can be utilized to determine the type of load and, therefore, can alter the profile to be utilized. Display (30) provides a visual communication device for the control module (22). Various self-test features including generating a simulated current to the digital control module (22) and automatic recovery if the execution of the stored program in the digital control module (22) is disrupted.

45 Claims, 17 Drawing Sheets

CIRCUIT BREAKER WITH INTEGRATED CONTROL FEATURES

TECHNICAL FIELD OF THE INVENTION

The present invention pertains in general to circuit breakers and, more particularly, to a circuit breaker with an integrated controller for determining trip conditions and effecting tripping of the circuit breaker under those trip conditions.

CROSS-REFERENCE TO RELATED APPLICATIONS

This application is related to U.S. Pat. No. 4,949,214, issued Aug. 14, 1990, which patent is incorporated herein by reference.

BACKGROUND OF THE INVENTION

Circuit breakers have been designed to prevent the current through an AC line from exceeding a predetermined energy level to both prevent fires and to prevent damage to loads that are disposed on the lines. Typically, circuit breakers have utilized a thermal switch which, when reaching a certain temperature due to excessive current passing therethrough, will cause the breaker to trip.

There are a number of disadvantages to present circuit breakers, the primary one being the manner in which they make a trip determination. This trip determination is typically made based upon a predetermined amount of current passing through a thermally sensitive element, whose characteristics change at certain temperatures. These characteristics will cause a mechanical trip to occur at temperatures above a predetermined threshold. However, these type of breakers have little sensitivity to the type of load and merely react to the RMS current. For example, some loads require a large amount of inrush current when they start up. This can potentially trip a breaker unnecessarily. Another disadvantage is that with respect to "arcing," wherein the line has a small gap disposed therein, the current therethrough being intermittent but on the average less than necessary to trip the breaker. However, this arcing can result in sparks that can potentially cause a fire.

With respect to inrush current, this refers to the amount of current that is required whenever a line has voltage initially applied thereto. This inrush current differs from load type to load type. The decay or recovery of the startup load is another variable. Some loads, such as those associated with incandescent lighting, recovers in one to two half-cycles (8 to 16 milliseconds). Other loads, such as vacuum cleaners, have an exponential decay lasting 10 to 40 half-cycles (80 to 300 milliseconds), while motors which start under load, such as those used with air compressors, spas, and swimming pool pumps tend to maintain constant high current for several cycles, 10 to 20, then rapidly decay to their normal operating current.

Another condition that must be taken into account is the condition when a motor electrically or mechanically stalls during startup. In the case of mechanical stalling, the motor typically maintains its maximum startup current until the motor burns up and/or the breaker trips. Electrical stalling differs in that the motor is starved for starting current and is unable to develop enough speed to counter the EMF to achieve normal operating current. As the current is still quite high in this condition, this tends to damage the motor by overheating before the circuit breaker trips. Several things can cause electrical stalling: brownout (low line voltage), the wire being too small for the distance involved, connection contact resistance (wire nuts, contacts), and for multi-phase breakers where one leg is defective or tripped. All these electrical stalling conditions reduce the operating voltage to the motor causing a loss of current necessary to produce starting torque.

Even after the motor has successfully reached a startup condition without tripping the breaker, there is still the consideration of the motor load current surging during usage. These surge currents may range from low operating currents to maximum startup currents. Motor surging is often due to alternate loading and unloading of the motor, such as hydraulic resonance of water and entrapped air in a water pump system or an elastic coupling driving an inertial load in a mechanical arrangement.

The following table illustrates a typical residential circuit breaker trip time versus constant overload.

TABLE 1

Typical Residential Circuit Breaker Trip Times vs Constant Overload

| % Of Breaker Rating | 20 Amp Rating | 30 Amp Rating | Circuit Breaker Trip Time |
| --- | --- | --- | --- |
| 100% | 20 Amps | 30 Amps | No Trip |
| 200% | 40 Amps | 60 Amps | 50 Sec |
| 300% | 60 Amps | 90 Amps | 12 Sec |
| 500% | 100 Amps | 150 Amps | 3 Sec |
| 1,000% | 200 Amps | 300 Amps | 0.62 Sec |
| 5,000% | 1,000 Amps | 1,500 Amps | 0.01 Sec |

One of the primary disadvantages, as noted above, is that a conventional circuit breaker does not account for the differing type of load or for the variations of loads during operation thereof It merely trips when the load current exceeds its rating for a specified time or fails to trip when it in actuality should due to arcing, etc. There is a class of circuit breakers, called magnetic, which will trip immediately when instantaneous currents exceed 8×10x of the breakers ratings. However, again these breakers do not account for differing type of loads and also are susceptible to false tripping because of their speed. Although the false tripping of the circuit breaker due to high inrush currents does protect the system, it is bad for the breaker, since the tripping of a breaker in and of itself can cause the breaker to fail. Present-day circuit breakers are typically rated for only one trip. The manufacturer recommends replacement of the breaker after each tripping. This, in part, is due to the fact that the breaker trips at any current level and, at high current levels, this can cause damage due to heavy arcing across the contacts.

SUMMARY OF THE INVENTION

The present invention disclosed and claimed herein comprises an intelligent circuit breaker for controlling the current flow from an AC mains to a load. The circuit breaker includes a series breaker element that can be controlled by a generated control signal to control current flow to the load through the breaker element. A parameter sensor is provided for sensing the current flow parameters of the circuit breaker as current is supplied to the load. A storage device is operable to store predetermined performance parameters for desired relationships between the current and the load that define successful operating current constraints of the load. A controller compares the sensed current flow parameters detected by the parameter sensor to the stored, predetermined performance parameters and then generates the control signals when the sensed current flow parameters flow outside of the acceptable operating current constraints.

In another aspect of the present invention, an input/output port is provided for communicating with the controller from a point external to the circuit breaker. This allows information to be transmitted to the controller and information to be transmitted from the controller to the external location. The controller is then operable to receive from the input/output port new, desired relationships for storage in the storage device. The information transmitted from the external location to the controller can be of a nature that allows the external location to override the operation of the controller and cause the controller to generate the control signal.

In a further aspect of the present invention, the parameter sensor comprises a current sensor that is operable to sense the level of AC current supplied on the load side of the circuit breaker. In one embodiment, the current sensor is comprised of a toroid that has a secondary winding and a primary winding. The secondary winding provides the current output and primary winding is adapted to interface with the load side of the breaker element. A bus is provided on the load side of the breaker element having a finite resistance associated therewith. The ends of the primary winding are attached to the bus and spaced a predetermined distance apart, such that only a small portion of the current is routed through the primary winding.

In yet another aspect of the present invention, a zero crossing detector is provided for determining when the sensed current makes the transition from a positive to a negative or a negative to a positive value and thus goes through a zero value. The control signal will be generated when the current is determined to be proximate to the zero value. A voltage sensor is also provided for sensing the voltage on the load side of the breaker element, with a voltage zero crossing detector provided for determining when the voltage passes between positive and negative values and a substantially zero value. This allows the phase angle between a current and a voltage to be determined. This phase angle is utilized to determine the type of load that is present, which is a function of the predetermined phase angle. Additionally, the storage device is operable to store a plurality of different, distinct, desired relationships with a selection device provided for selecting one of the desired and distinct relationships as a function of the type of determined load after determination thereof by the determination device.

In a yet further aspect of the present invention, the predetermined parameters comprise in part a plurality of trip point profile curves. These trip point profile curves provide a constraint value for current as a function of time, above which constraint the breaker will be controlled by the generation of the control signal to cause a trip condition. These profiles are selectable, either by the user or as a function of the measured parameters.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
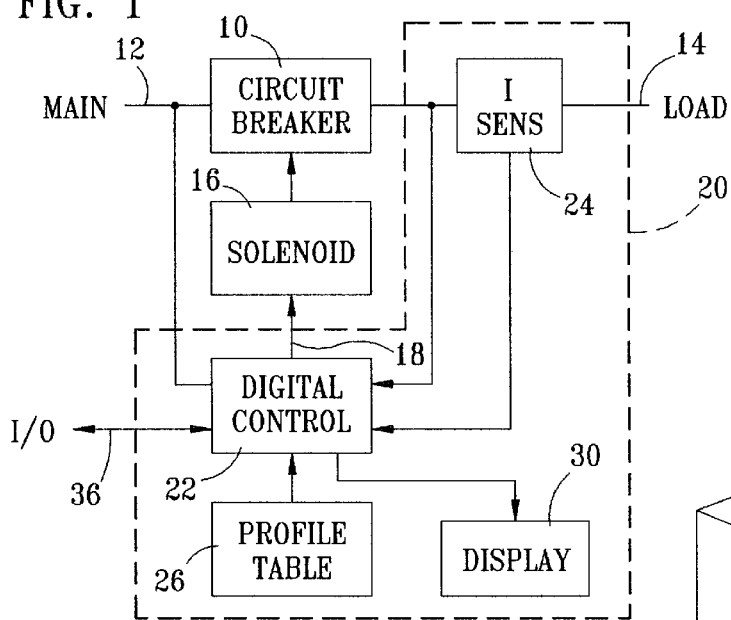
FIG. 1 illustrates an overall block diagram of the circuit breaker of the present invention.

Referring now to FIG. 1, there is illustrated an overall block diagram of the circuit breaker of the present invention. A conventional standard thermal circuit breaker 10 is provided having an input connected to a main terminal 12 and an output connected to a load terminal 14. The circuit breaker 10 is what is referred to as a Ground Fault Controlled Interrupter (GFCI) circuit breaker, which has associated therewith a solenoid 16 which is designed to be activated by a control signal on a line 18, which control signal on line 18 triggers the solenoid 16, thus bypassing the thermal aspects of the circuit breaker 10 and tripping the circuit breaker 10. The operation of these type of circuit breakers is described in detail in U.S. Pat. No. 4,949,214, which was incorporated herein by reference.

The present invention is utilized to act as an intelligent overlay to the operation of the circuit breaker 10 and provide the control signal on the line 18 for tripping the circuit breaker 10 at an appropriate time. The intelligent overlay is represented by a digital processing section 20 illustrated in phantom. Part of the digital processing section 20 is a digital control module 22, which is operable to generate the control signal on the control line 18 and receive as inputs, the voltage on the main lines 12, the voltage on the load terminal 14, and also, a current value received from a current sensor 24 disposed in series with the output of the circuit breaker 10. This therefore provides a measurement of the input voltage and output voltage of the circuit breaker 10 in addition to the current through the circuit breaker 10 on the load side of the breaker contacts (not shown). The digital control module 22 has associated therewith a profile table 26 which is operable to contain predetermined load profiles and a current associated therewith, as will be described in more detail hereinbelow. In addition, a display 30 is provided for displaying information about the operation of the system. The digital control module is operable to utilize the sensor inputs thereto in the form of voltage and current and effect generation of the control signal on line 18 in order to perform the trip. The criteria utilized for this tripping operation will be described in more detail hereinbelow.

Figure 2:
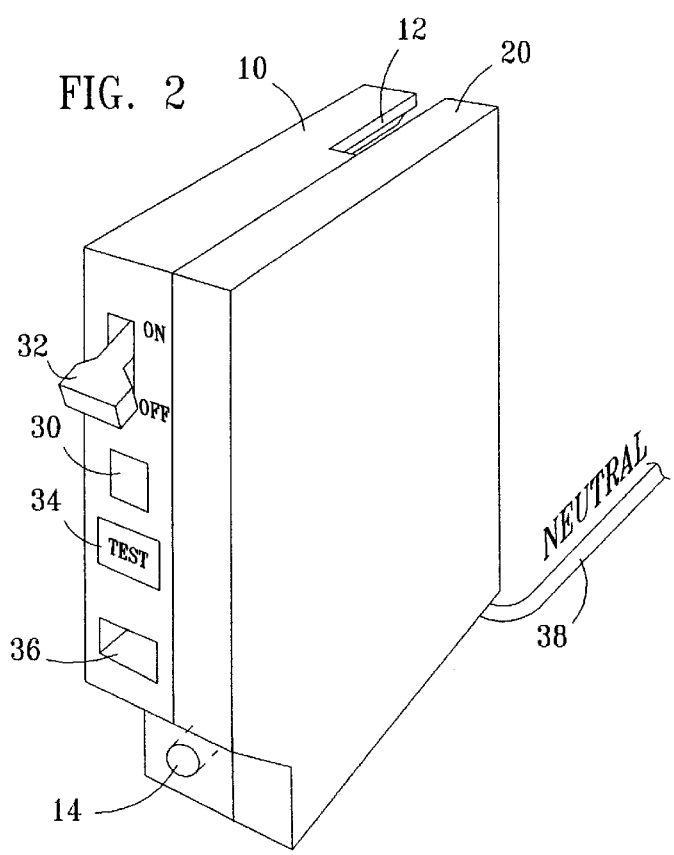
FIG. 2 illustrates the mechanical configuration of the circuit breaker of the present invention.

Referring now to FIG. 2, there is illustrated a perspective view of the circuit breaker 10 and the digital processing module 20. The digital processing module 20 is operable to be disposed in place of the conventional tripping mechanism which is associated with the GFCI circuit breaker. In this manner, the actual internal workings of the circuit breaker 10 do not need to be modified. As such, this will provide a circuit breaker having a conventional switch 32 for resetting the circuit breaker, a conventional test button 34 for testing of the breaker 10 and a conventional thermal tripping mechanism. A neutral wire 38 is provided, which is conventional and provides an internal reference. The input/output port 36 allows a user to communicate with the digital control module 22 for the purposes of transmitting data thereto in the form of commands or information associated with a profile. It also allows information to be retrieved from the digital control module 22 in the form of stored history information. For example, when a breaker trips, the current profile for the breaker is stored, such that a technician can, at a later time, retrieve this information to allow the technician to determine the loading on the circuit breaker that caused the trip condition. Power management feedback is another valuable application for digital readout.

Figure 3:
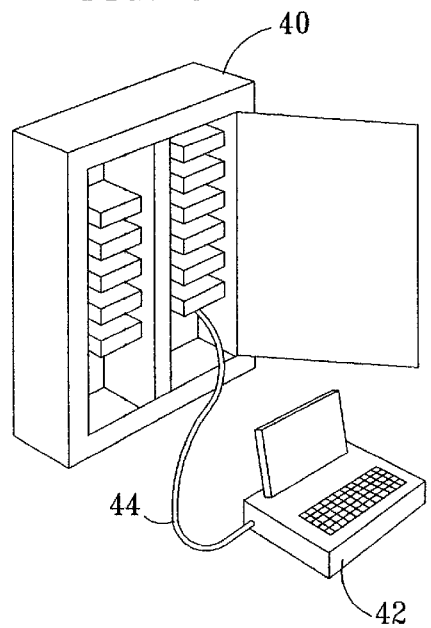
FIG. 3 illustrates one application of the circuit breaker of the present invention.
Figure 4:
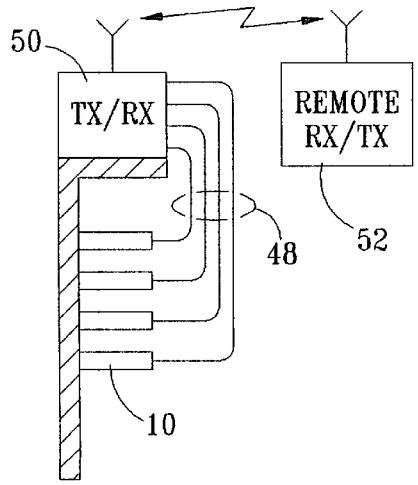
FIG. 4 illustrates an alternate embodiment of the circuit breaker of the present invention illustrating the remote access thereto.

Referring now to FIG. 3, there is illustrated a diagrammatic view of a plurality of circuit breakers disposed in a circuit breaker box 40, with a laptop computer 42 provided for interfacing a serial cable 44 to one of circuit breakers 10. This is a manner in which a technician would analyze a given electrical situation. Alternatively, as illustrated in FIG. 4, all of the circuit breakers 10 could be connected through a plurality of serial cables 48 to a transmit/receive block 50, which would allow wireless or wired communication between serial control modules 22 and a remote receiver/transmitter 52. The type of command information that is transmitted to the breaker can be data for use in defining the operation of the breaker or, alternatively, it can be a trip command. One application of the digitally enhanced breaker of the present invention is to allow a fire alarm to be connected thereto which, when activated, can result in the generation of a trip command that can be sent to and cause the breaker to automatically trip in response thereto. This command can also be a command that is sent from a municipal entity, such as the fire department or the police department. It would be advantageous for the fire department to have the ability to cause all breakers to trip automatically in the event that there were a fire. This is as opposed to trying to get to the breaker and turning it off before entering the premises. It is possible that unique ID codes could be associated with a given premises.

Figure 5:
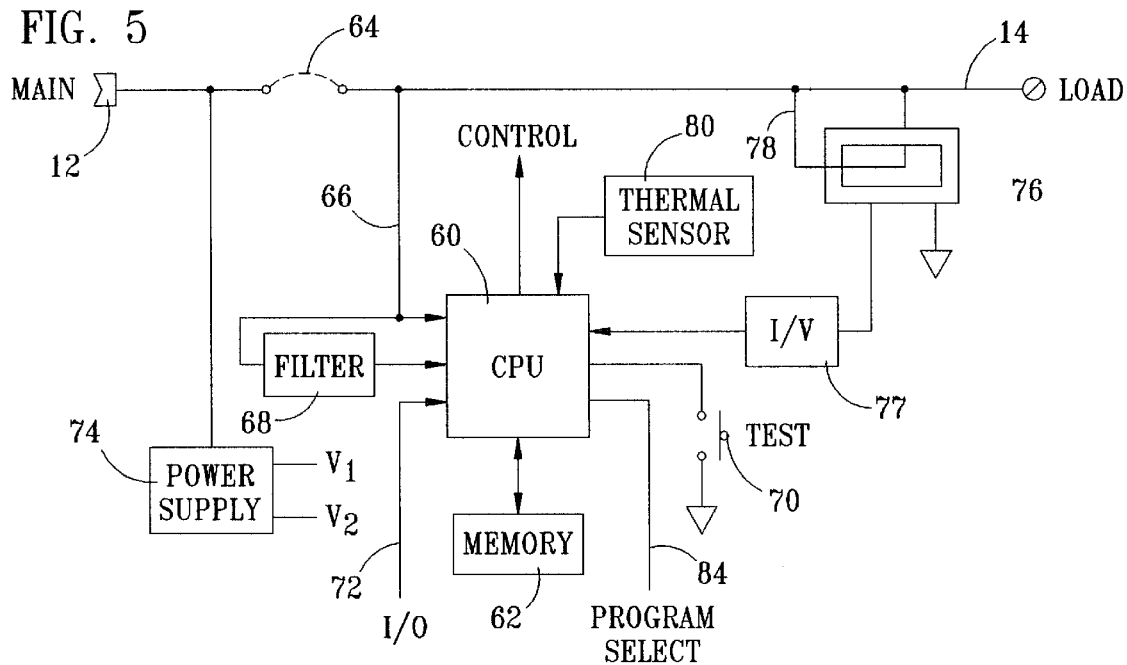
FIG. 5 illustrates a block diagram of the processing portion of the circuit breaker of the present invention.

Referring now to FIG. 5, there is illustrated a more detailed block diagram of the processing module 22. At the heart of the processing module is a central processing unit (CPU) 60, which, for example, is the PIC16C73 microprocessor (CPU), manufactured by MICROCHIP, which is a controller and has associated therewith a predetermined amount of memory, as represented by block 62. However, it should be understood that the memory 62 in the preferred embodiment is an integral part of the CPU 60, but it could be external to facilitate larger storage capacity. The CPU 60 has an input port that is connected to the load side of contacts 64 in the breaker 10 through a wire 66. This allows the AC voltage itself to be sensed. This is also filtered with a filter 68 to provide a second input to the CPU 60. The CPU 60 also receives a test input connected to a test switch 70 and an input/output serial data line 72. A power supply 74 is provided, which extracts power from the main terminal 12 and provides on the output thereof two supply levels, $V_1$ and $V_2$, $V_1$ being +10.0 V and $V_2$ being +5.0V.

The CPU also interfaces with the secondary of a toroid 76, which has a single primary winding 78 disposed through the center thereof and the two ends thereof connected at two separate points along the output load line 14. As will be described hereinbelow, the separation of the two ends of the primary winding 78 results in a predetermined amount of resistance disposed therebetween. This effectively acts as a current divider, such that a portion of the current going to the load passes through the primary winding 78. In this manner, the toroidal core 76 does not have to be disposed about the load and take the full current therefrom. Essentially, only about 1.0 Amp maximum is passed through the primary winding 78. The current extracted from the secondary on the toroidal core 76 is converted to a voltage with a circuit 77, which output comprises an analog voltage. This is converted to a digital value by the CPU 60.

A thermal sensor 80 in the form of, for example, a thermistor is disposed proximate to the circuit breaker 10 to sense the temperature thereof. The output of this is provided as an input to the CPU 60. In addition, a program select input on a line 84 is provided as an input to allow a user to select a given program. In the present and preferred embodiment, this is facilitated through the use of jumpers. However, any type of input that will allow a user to select programs would be an equivalent function.

Figure 6:
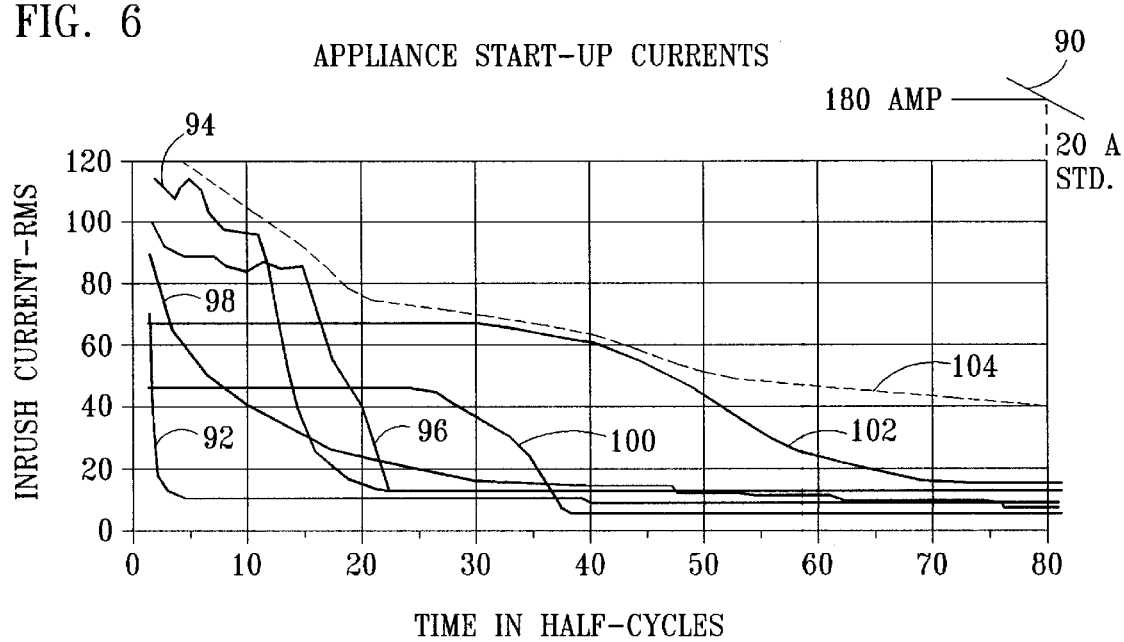
FIG. 6 illustrates a graph depicting various startup current load profiles.

Referring now to FIG. 6, there is illustrated a graph depicting appliance startup currents versus time in half-cycles. The inrush current is found on the Y axis and varies from 0.0 Amps RMS to 120.0 Amps RMS. It can be seen that in the first ten half-cycles, the current can run as high as 100.0 Amps. This, of course, decreases to a level below 20 Amps, which is the circuit breaker example utilized in this graph of FIG. 6. In the upper right-hand portion of the graph is illustrated a line 90 representing the response of the circuit breaker to inrush current for a 20 Amp standard circuit breaker. It can be seen that a level of 180.0 Amps would require 80 half-cycles in order to trip the conventional breaker.

In the graph of FIG. 6, there are illustrated profiles for six types of load. A profile 92 represents the response for a 1 kw lamp load, illustrating that the inrush current goes up to a very high value for a very short period of time, and then falls down below the 20 Amp level at approximately three to five half-cycles. A profile 94 is associated with a compressor with a stiff power source, illustrating that the current goes up to a level exceeding 80 Amps and does not fall below the 20 Amp level until near 20 half-cycles. A profile 96 is representative of a compressor with a soft power source illustrating that the initial inrush currents are slightly lower, but it requires more than 20 half-cycles to fall below the 20 Amp level. A vacuum cleaner profile is illustrated by a profile curve 98, which exhibits an exponential decay from an inrush current that exceeds 80 Amps to a current of less than 20 Amps after approximately 23 half-cycles. An air conditioner profile is represented by a profile curve 100, which rises to a level above 40 Amps and does not fall below the 20 Amp level until approximately 35 half-cycles. Additionally, a compressor profile with a 100-foot extension foot is represented by a profile curve 102, which illustrates that the initial inrush current is high, but the 100-foot extension cord results in a very soft power source and the inrush current being maintained above the 20 Amp level for over 60 half-cycles. There is illustrated a dotted line 104 that illustrates the ideal curve that, if followed, would prevent tripping for all of the profiles 92–102. As long as the current versus time in half-cycles falls below this, this would represent the normal activity of the load. If it exceeds the current level represented by the profile 104, this would represent an overcurrent condition, which would not be sensed by the standard breaker, as represented by the curve 90. Therefore, by possessing the ability to recognize when current is initially applied to a load during startup of that load and determining if they exceed an ideal profile, as represented by the curve 104, a more reliable circuit breaker would result.

In addition to the inrush current, additional factors must be considered when determining when to trip a breaker, these being the short circuit current, the circuit breaker trip time, the energy in arc (size of sparks), and the flash point of combustible material. In general, short circuit current ranges from 45 Amps to 1200 Amps. Combustible material can range from tissue paper and Christmas trees to the actual wood in the 2×4 studs. Paper is provided in most electrical outlets, i.e., paper is utilized to cover the ground wire. Paper is also found on sheetrock and the backing on insulation. Sawdust chips are frequently found on or near most electrical outlet boxes from drilling holes in the 2×4 studs to run the electrical wires.

Due to the complexity of providing profiles for high startup current and electrical wiring shorts, multiple trip profiles and special filtering will be needed to maximize electrical fire protection, while minimizing nuisance trips.

Figure 7:
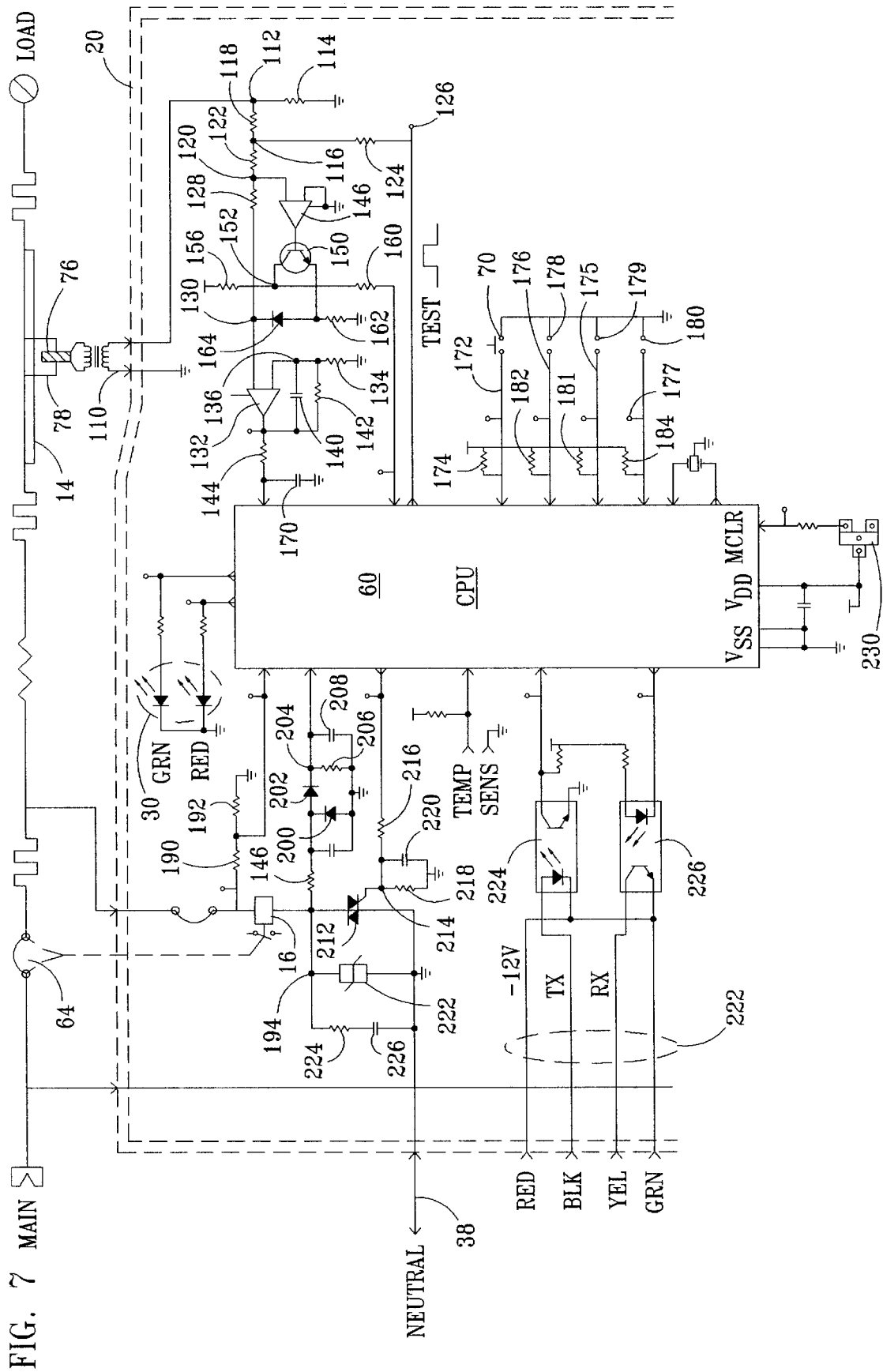
FIG. 7 illustrates a detailed logic diagram of the circuit breaker of the present invention.

Referring now to FIG. 7, there is illustrated a detailed logic diagram of the digital processing section 20. The toroidal core 76 is illustrated as having the primary winding 78 as a single wire passing through the central of the core 76 and a secondary 110, which is attached on one side to ground and on the other side to a node 112, node 112 connected to ground through a resistor 114. Therefore, a voltage will be developed on node 112 with the ratio of the toroidal core 76 being 1:1000. The primary wire 78 is a 22 gauge wire, whereas the secondary is a much smaller gauge and has approximately a thousand turns disposed thereon, the ends of the primary winding separated by a distance of approximately 7 millimeters. The voltage developed on node 112 is then coupled to a node 116 through a resistor 118 and then to a node 120 through a resistor 122. Node 116 is operable to be connected through a resistor 124 to a test terminal 126, test terminal 126 also connected to an output on the CPU 60 to receive a test pulse. This test pulse received on the output from test terminal 126 results in a voltage disposed on node 116 representing a predetermined level of current. It should be understood that a Hall Effect device could be utilized in place of the toroidal core 76 to sense current flowing in the AC line.

The node 120 is connected through a resistor 128 to a node 130. Node 130 is connected to the positive input of an amplifier 132, the negative input thereof connected to ground through a resistor 134 and to node 136. Node 136 is connected to the negative input of amplifier 132 and also connected through a parallel connected capacitor 140 and resistor 142 to the output of amplifier 132, this representing a feedback network. The output of amplifier 132 is connected through a resistor 144 to an input of the CPU 60.

The node 120 is connected to the negative input of amplifier 146, the positive input thereof connected to ground. The output of amplifier 146 is connected to the base of an NPN transistor 150, the emitter thereof connected to a node 154 and the collector thereof connected to a node 152. Node 152 is connected to the positive supply voltage $V_2$ at a level of +5.0V through a resistor 156 and to an input of the CPU 60 through a resistor 160. Node 154 is connected to ground through a resistor 162 and to the anode of a diode 164, the cathode thereof connected to node 130.

In operation, when the voltage on node 130 goes high, the output of amplifier 132 will follow, charging up a capacitor 170 connected across the current input on the other side of resistor 144 to the CPU 60. When the signal at node 112 is negative, the signal node 120 will cause the output of amplifier 146 to go high, turning on transistor 150 and causing current to flow through resistor 162. This will raise node 154 above node 130, thus increasing the voltage of node 130, to cause node 130 to follow the inverse of the waveform on node 112. This will effectively form a full-wave rectifier. The signal on node 152 that is input to the CPU 60 through resistor 160 represents a SIGN input indicating that the input waveform is negative. Therefore, the circuitry connected between the secondary 110 and the current input on CPU 160 allows the peak current to be detected and the RMS current to be calculated. This will be described hereinbelow.

Test switch 70 is connected between ground and a node 172, which node 172 is connected to a test pin and also to the +5.0V power supply through a pull-up resistor 174. There are provided three program inputs 176, 177 and 175, which can be pulled low to ground through jumper terminals 178 (J1), 179 (J2) and 180 (J3), respectively. The input 176 is connected to the +5.0V power supply through a resistor 182 and the input 177 is connected to the same power supply through a resistor 184, with input 175 connected to the power supply through a resistor 181. The following table illustrates the programming; however, any type of programming could be required with the internal programming of the CPU defining what profile will be selected.

TABLE II

| J1 | J2 | J3 | RESULT |
|---|---|---|---|
| GND | GND | GND | — |
| GND | GND | +V | Std, No Arc |
| GND | +V | GND | Fast |
| GND | +V | +V | Std |
| +V | GND | GND | — |
| +V | GND | +V | — |

TABLE II-continued

| J1 | J2 | J3 | RESULT |
|---|---|---|---|
| +V | +V | GND | — |
| +V | +V | +V | — |

The voltage on the load side of the breakers 64 on terminal 14 is connected to one side of two series-connected resistors 190 and 192, the common connection therebetween providing an input to the CPU 160. This effectively divides the voltage down such that an AC voltage can be detected for both performing a zero crossing detection operation and also for determining if the coil is present. The solenoid 16 also has one side of the driving coil thereof connected to the load terminal 14 on the load side of the contact 64 and the other side thereof connected to a node 194. Node 194 is connected through a resistor 146 to a node 198. Node 198 is connected to the cathode of a diode 200, the cathode thereof connected to ground, and also to the cathode of a diode 202, the anode thereof connected to a node 204. Node 204 is connected to ground through a resistor 208, the other side thereof connected to ground. Node 204 constitutes an input to CPU 60. Essentially, the diodes 200 and 202 provide a clamped input that prevents the input from going more than one diode drop below the ground level and will be supplied to node 204 and to resistor 206 on the positive swing of the input signal.

A triac 212 is provided having one side thereof connected to node 194 and the other side thereof connected to the neutral wire 38, which comprises ground for the CPU 60. The gate of triac 212 is connected to a node 214, which is connected through a resistor 216 to a control output of the CPU 60. Node 214 is also connected to ground through a resistor 218, with a capacitor 220 connected between node 214 and ground. A transient suppressor 222, which is a metal-oxide-varistor (MOV), is connected across triac 212 with a series-connected resistor 224 and capacitor 226 connected across triac 212. Only when triac 212 is conductive is solenoid 16 turned on by pulling node 194 low to the potential of the neutral wire 38. Until then, node 194 will follow the voltage on the load terminal 14, this providing a voltage on the opposite side of the coil 16 to that provided by the resistors 190 and 192. Therefore, the zero crossing detect input and the node 194 can be sensed to determine if the solenoid 16 is, in fact, intact. If there is an open circuit in the solenoid 16, this will be detectable.

The Input/Output function is based upon an RS 232 interface requiring a series of three lines 222, a red line, a black line, and a yellow line. The red line is the −12.0V input, whereas the black line is the transmit input (TX), and the yellow line is the receive input (RX). The green line is a redundant line connected to the −12.0V input. The transmit input on the black line is connected to one side of an optocoupler 224, the other side thereof connected to one input of the CPU 60. The yellow receive input on lines 222 is connected to one side of an optocoupler 226, the other side thereof connected to an output of the CPU 60. This operates in accordance with a conventional RS232 protocol.

A Clear input MCLR is connected to one side of a three-terminal reset circuit 230, the other side thereof connected to ground and the control input thereof connected to the +5.0V input, which also constitutes the $V_{dd}$ input to the CPU 60. The circuit 230 is a conventional reset circuit of the type MAX889, manufactured by MAXIM. This circuit 230 is operable to determine if there is a "brownout" condition wherein the voltage on the power supply input to the CPU 60 falls below a predetermined level. When this occurs, the circuit 230 generates a reset input and maintains this reset input at an appropriate level until the voltage comes up above an acceptable level. In this manner, it is insured that a reset will be applied to the CPU 60 when it enters an appropriate operating condition. The purpose of the circuit 230 is specifically for this type of operation.

Figure 8:
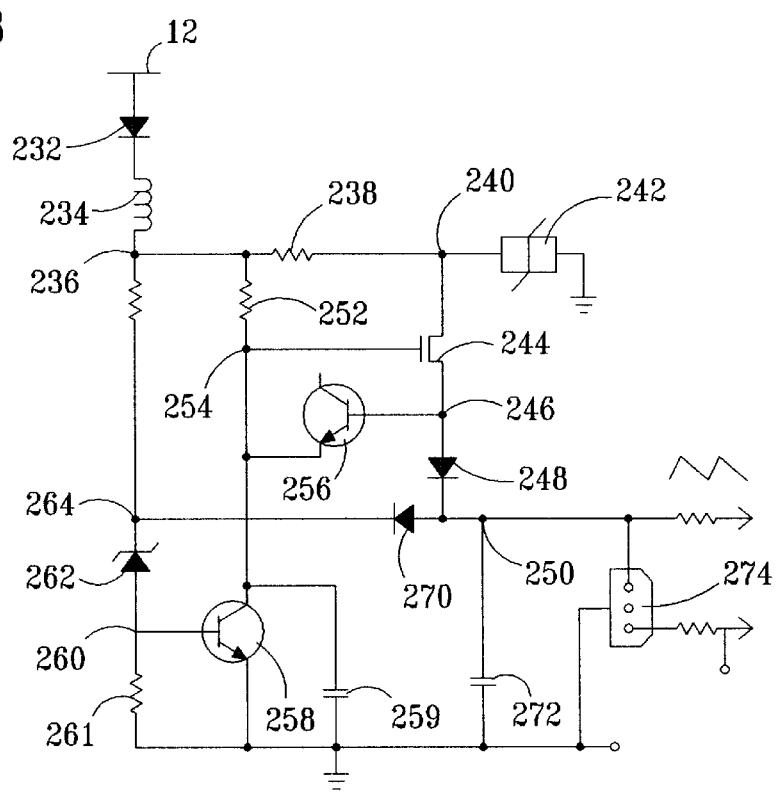
FIG. 8 illustrates a detailed schematic diagram of the power supply.

Referring now to FIG. 8, there is illustrated a detailed schematic diagram of the power supply 74. A diode 232 has the anode thereof connected to the main terminal 12 and the cathode thereof connected through a filter inductor 234 to a node 236. Node 236 is connected through a resistor 238 to a node 240, node 240 having one side thereof connected to a transient suppressor 242, the other side of transient suppressor 242 connected to ground. An FET 244 has the source/drain path thereof connected between node 240 and a node 246. Node 246 is connected to the anode of the diode 248, the cathode thereof connected to a node 250. Node 236 is connected through a resistor 252 to the node 254. Node 254 is connected to the collector of an NPN transistor 258, the emitter thereof connected to ground and the base thereof connected to a node 260. Node 260 is connected through a resistor 261 to ground and to the anode of a zener diode 262, the cathode thereof connected to a node 264, node 264 connected to node 236 with through a resistor 266. Node 250 is connected to the anode of a diode 270, the cathode thereof connected to node 264. Node 250 has a capacitor 272 disposed between node 250 and ground with a three-terminal regulator 274 disposed between node 250 and ground, the output terminal of the regulator 274 is for providing the +5.0V level and the node 250 providing the +10.0V level.

In operation, diode 232 provides half-wave rectification to place a half-wave rectified signal on node 236. When the voltage initially rises from a zero level, current is negligible through zener diode 262 and resistor 252, such that the gate of FET 244 is pulled high, causing FET 244 to conduct and charge capacitor 272 through diode 248. As the voltage continues to rise, zener diode 262 will conduct and turn transistor 258 on. When transistor 258 turns on, FET 244 is turned off, such that FET 244 will not conduct while the AC voltage is greater than about 30 to 40 volts. However, when the voltage again goes below 30V–40V on the negative going side of the positive portion of the AC swing, the transistor 258 will turn off and FET 244 will again turn on, such that current is provided twice during each positive half-cycle. This improves efficiency and allows the use of a smaller filter capacitor. Regulation is improved by the diode 270 which conducts when the output voltage is greater than a diode drop above the zener voltage of diode 262. This diode 270 makes the value of resistor 261 less critical and also makes the output voltage less sensitive to load current. The diode 256 utilizes the $V_{EBO}$ of the transistor as a 7-Volt zener diode to clamp the gate-source voltage of the FET 244, since that should not exceed approximately 20 Volts. A capacitor 259 is connected across the collector/emitter of transistor 258 to slow the rate of rise of the voltage of the collector thereof, such that when the power is applied at the peak of the AC cycle, the gate voltage of FET 244 rises at a controlled rate, thus allowing the transistor 258 time to detect and clamp the overvoltage condition.

Figure 9:
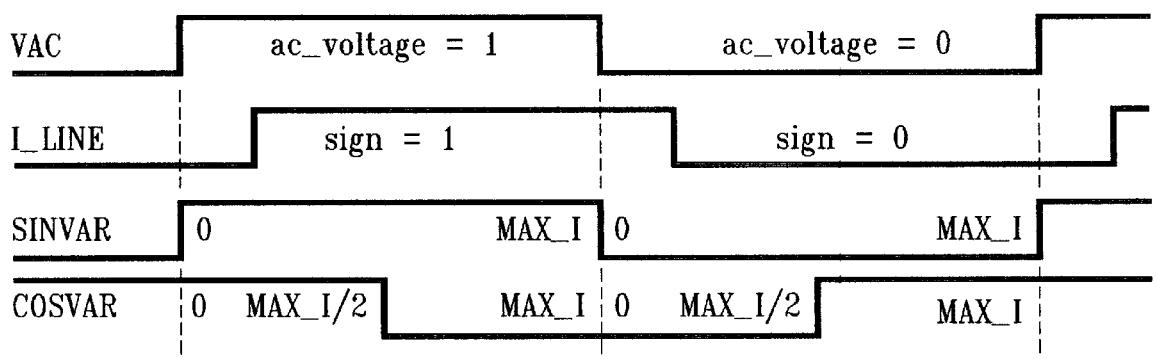
FIG. 9 illustrates waveforms depicting the phase algorithm.

Referring now to FIG. 9, there are illustrated waveforms for calculating phase by simulating a synchronous detector. The sign input, which is extracted from node 152 in response to transistor 150 being turned on or off, is determined on the curve I_LINE, with the tapped voltage on the common point between resistors 190 and 192 utilized to generate the waveform VAC. It can be seen that when the signal VAC goes high, this indicates that the zero crossing has gone from a negative to a positive and the value is equal to "1". The current, on the other hand, will change sign when it goes from a negative to a positive and the sign will go to a value of "1". This occurs at the zero crossing of the current waveform. The difference between these two waveforms constitutes the phase angle. In the preferred embodiment, the phase algorithm determines a cosine term, COSVAR, and a sine term, SINVAR. The cosine term is calculated by first determining if the zero crossing value is high, i.e., whether the signal VAC is high. If it is high, then the output of the analog-to-digital conversion operation (ADC) of the detected current from the output of resistor 144 is summed with the previous cosine term. If the zero crossing value is "0", i.e., the VAC is low, then the output of the ADC operation is subtracted from the accumulated cosine term. For the sine term, the sample count is shifted by a value of "8", there being a total of sixteen samples for each half cycle of the AC signal. If the sample count is greater than 7, then the accumulated sine value is incremented by the output of the ADC operation and, if it is less than 8, it is decreased. The sample count is initiated when the zero crossing is detected and terminated at the next zero crossing for a negative value, wherein the zero crossing is equal to "1", if the line voltage is greater than 0 and "0" if it is less than 0. This is illustrated in FIG. 9. The accumulated cosine sum and the accumulated sine sum are proportional to the cosine and sine of the phase angle between the line voltage and current. Their ratio will be the tangent of the phase angle. Since the tangent increases monotonically, it can be utilized directly in the decision-making operation. Whenever the sample count is greater than 14, then the tangent of the phase angle is calculated. The program for the phase angle determination is as follows:

will also be described hereinbelow, these curves can actually be learned from history information associated with the system. After the appropriate power-up trip curve is loaded, the program flows to a function block 302 wherein the microprocessor is initialized. This is a conventional operation with a microprocessor. The program then flows to a function block 304 to perform a self-test operation. As described hereinabove, the self-test operation is an operation which includes in part the generation of a test pulse on the line 126 which raises the node 116 high through resistor 124, with reference to FIG. 7. This places a predetermined voltage on node 120, turning off amplifier 146 and turning on amplifier 132 to a predetermined level. This analog value is then converted to a digital value through the internal analog-to-digital conversion in the CPU 60 and then compared to an expected value. If the measured value is within acceptable limits of the expected value, then the test is successful. Additionally, the voltage on both sides of the solenoid 16 is tested to determine if the solenoid is present, i.e., the driving coil therein conducts. The gate voltage to the triac 212 is also tested for a short period of time which time is insufficient to actually turn on the triac 212.

After the self-test operation, the program will flow to a decision block 306 to wait for a zero crossing. Until the zero crossing occurs, the program will flow back around a "N" path to the input thereof. When the zero crossing occurs, the program will flow along a "Y" path to a function block 308 to transfer serial data through the I/O port, if data is to be transmitted. The program will then flow to a function block 310 to then perform a reading of the detected current after conversion to a digital value. This is effectively a "sample". The program will then flow to a function block 312 to determine the phase angle and then to a function block 314 to accumulate the current data. The program then flows to a function block 316 to determine if a trip condition exists and

---

PHASE ALGORITHM:

```
Do_phase( )
{
if    ((sample_cnt==0) && (AC_VOLTAGE==1))
  {
    cosH=cosL=0 ; //      Clear accumulators at beginning of full cycle.
    sinH=sinL=0 ; // COSVAR=cosH*256+cosL,    SINVAR=sinH*256+sinL.
  }
if (ac_voltage == 1)    sign= 1      ;//     For the COSVAR accumulation.
              else sign = -1 ;
COSVAR = COSVAR+sign*ADRES*sin_table(I)   ; value proportional to sin(phase)
if    (sample_cnt>= (MAX_I/2))    sign =!sign    ;//    For the SINVAR accumulation.
SINVAR = SINVAR+sign*ADRES*cos_table(I)    ; value proportional to cos(phase)
//      Phase calculation is complete when sample_cnt=MAX_I and AC_VOLTAGE=0.
//      That is, at the end of a negative half-cycle.
if (sample_cnt==MAX_I)       // Select trip profile base on phase.
              Select_profile ( );
}
```

---

Figure 10:
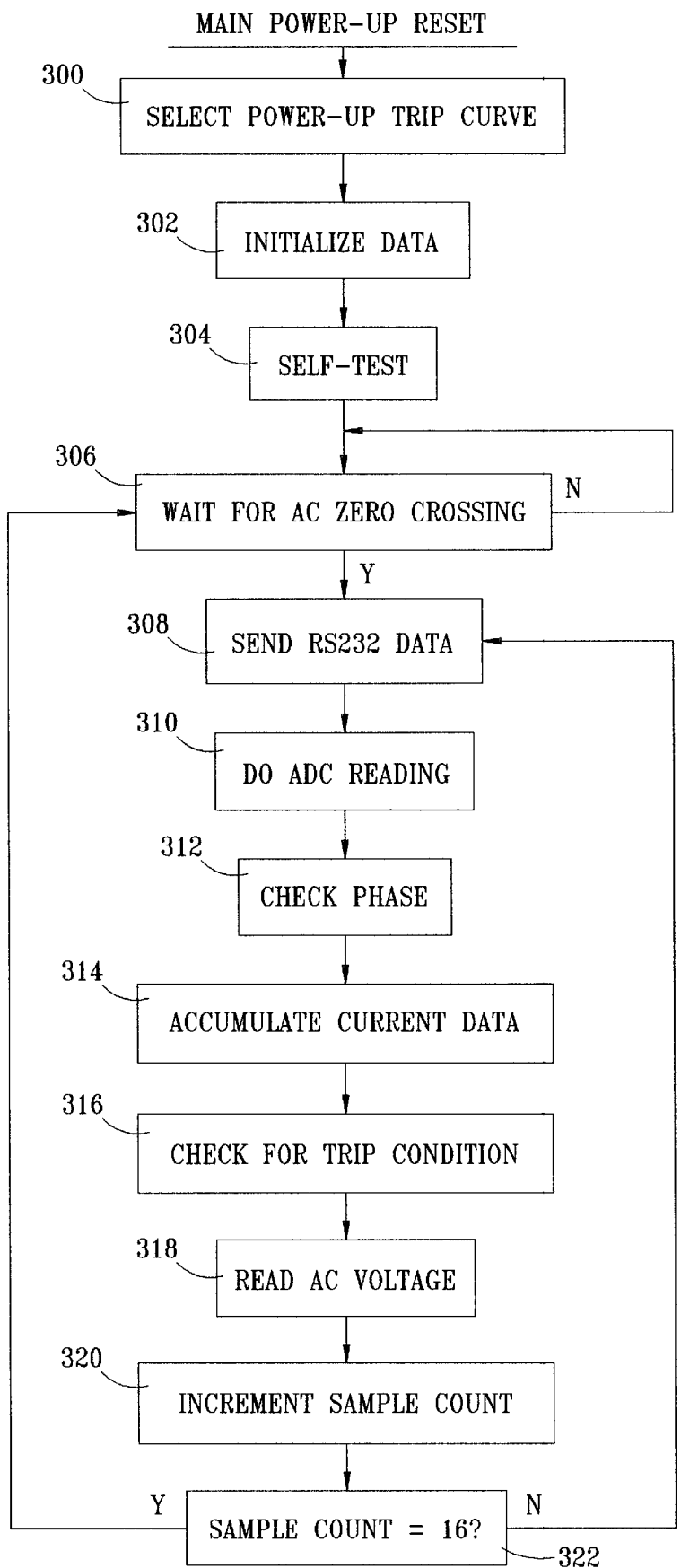
FIG. 10 illustrates a flowchart depicting the operation for the main program operation.

Referring now to FIG. 10, there is illustrated a flowchart for the main power-up reset operation. This program is initiated at a function block 300 wherein a power-up trip curve (profile) is selected. As described above, these are predetermined curves that define the trip current as a function of time to account for various input inrush currents and load conditions. The power-up trip curve is selected upon power up of the system, i.e., when the CPU 60 is reset or brought into operation. This is basically a default power-up trip curve or profile. This profile is selected for a predetermined duration of time to ensure that all self-test operations, etc., have been performed. Thereafter, the user-defined profile is used, which is referred to as a "running" profile. As then flows to a function block 318 to read the AC voltage. The program then flows to a function block 320 to increment the sample count and then to a decision block 322 to determine if the sample count is the maximum sample count of 16. Until the sample count has reached its maximum, the program will flow back to the function block 308 to again send RS 232 data. When it reaches the maximum count, the program will flow along the "Y" path back to the input of decision block 306 to wait for the next zero crossing. This therefore insures that only 16 samples are taken for each half cycle.

Figure 11:
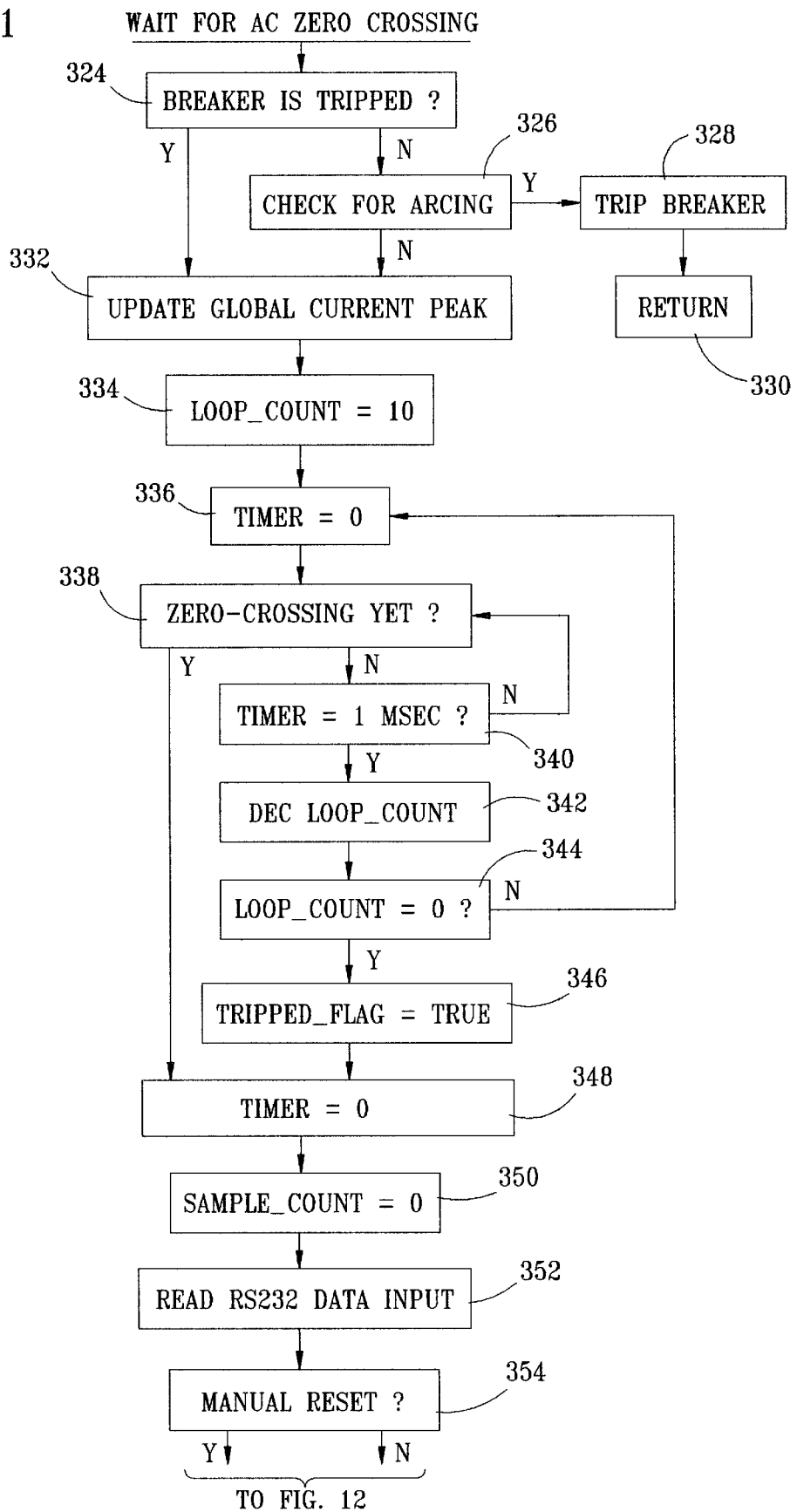
FIGS. 11 and 12 illustrate a flowchart depicting the zero crossing operation.

Referring now to FIG. 11, the zero crossing operation is described, as associated with decision block 306 in FIG. 10.

The program is initiated at a decision block 324 to determine whether the main part of the breaker has tripped for any reason. If so, the program flows along a "Y" path and, if not, the program flows along a "N" path. When the breaker is not tripped, the program flows to a decision block 326 along the "N" path, decision block 326 determining whether there is any arcing. This is determined in accordance with a predetermined algorithm, which will be described hereinbelow. If arcing is present, the program flows along a "Y" path to a function block 328 to trip the breaker and then to a return block 330. If arcing is not present, the program will flow to a function block 332, wherein a global current peak value will be updated. This essentially is the long term peak current that is determined for the current waveform. By comparing the peak current for a given cycle with a previously stored current, it will be updated only if the new current is greater than the previously stored current. This function block 332 is also the function block from which the "Y" path of function block 324 flows to when the breaker is tripped.

Once the global current peak value has been updated, the program will flow to a function block 334 to set the loop count value equal to "10", and then the program will flow to a function block 336 to set an internal timer to a value of "0". The program then flows to a decision block 338 to determine if the zero crossing has occurred. If not, the program flows along an "N" path to a decision block 340 to determine if the timer has incremented to a value of 1 msec. If not, the program will loop back to decision block 338. When the timer has timed out to 1 msec, the program will flow along a "Y" path to a function block 342 to decrement the loop counter and then to a decision block 344 to determine if the loop count is equal to "0". If not, the program flows back to the input of function block 336 and, if so, the program flows along the "Y" path to a function block 346 to set the Tripped Flag to a true value. The program then flows to a function block 348 to set a timer value equal to "0". If the zero crossing had been detected at decision block 338, the program will flow along a "Y" path to the function block 348 to also set the timer equal to a "0" value.

After the time has been set to a "0" value at function block 348, the program will flow to a function block 350 to set the sample count equal to "0". The program will then flow to a function block 352 in order to read the data input on the serial data port, if data is there. The program will then flow to a decision block 354 to determine if a manual reset has been performed, i.e., the lever is manually moved to the "ON" position. The program with either flow along a "Y" path or an "N" path.

Figure 12:
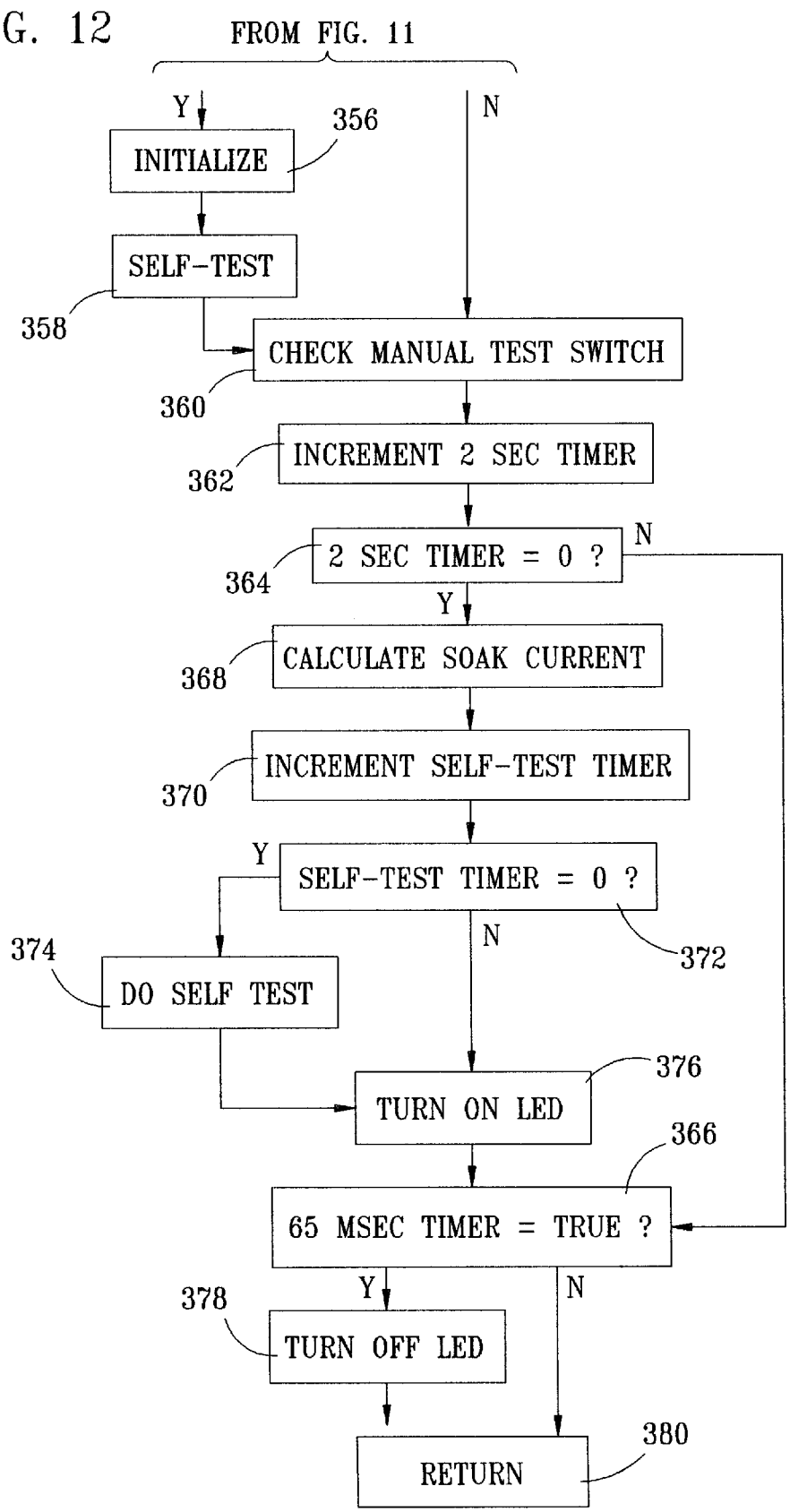

Referring now to FIG. 12, there is illustrated a continuation of the flowchart of FIG. 11. If a manual reset has been performed, the program will flow to a function block 356 to initialize the system and then to a function block 358 to again perform the self-test. The program will then flow to a function block 360 to check the manual test switch. This function block 360 is also where the "N" path from decision block 354 flows. The program then flows to a function block 362 wherein a two-second timer is incremented, which two-second timer is a continuous cycling timer. The program then flows to a decision block 364 to determine if the value of a two-second timer is equal to "0". If it is equal to "0", it flows along the "Y" path to a function block 368 to calculate the soak current and, if not, it flows along the "N" path to a function block 366 to determine if the value of a 65 msec timer is true.

The function block 368 for calculating the soak current calculates the long term running average value for the current that represents current history. After the soak current is calculated, the program flows to a function block 370, which increments the self-test timer. The program then flows to a decision block 372 to determine if the self-test timer is at a "0" value. If so, the program flows along a "Y" path to a function block 374 to perform the self-test and, if not, the program flows along an "N" path to a function block 376 to turn on the LED, which is also the path that is followed after the function block 374. The output of the function block 376 goes to decision block 366 to determine if the 65 msec timer is true. If the 65 msec timer is true, the program will flow from decision block 366 along the "Y" path thereof to function block 378 to turn off the LED and then to a return block 380, this 65 msec time being the time the LED is OFF for a blinking display condition. If the 65 msec timer is not true, i.e., it has not timed out, the program will flow along an "N" path to the return block 380. The flowcharts of FIG. 11 and 12 initially will test for a zero crossing by looping through a sub-routine for a period of 10 msec. If the zero crossing has not been detected in 10 passes through the loop blocks 338–344, then a trip flag will be set equal to true, this indicating a trip condition. However, once the zero crossing has been detected, the timer value is set for "0" and the sample count value is set to "0". Thereafter, each 2 seconds the soak current is calculated and then the self-test timer incremented. After a predetermined number of 2 second increments, the self-test timer times out and then the self-test is performed. The LED is turned on (if data indicates that it should be) to indicate problems that may exist as a result of the self-test and this LED is maintained on for a period of 65 msec, after which it is turned off. If the self-test is not again done on the next pass, the LED will again be turned on in the path between decision block 372 and function block 376 to result in a flashing LED. Of course, if the self-test does not result in data indicating that the LED should be turned on, it will not be turned on. This provides a visual display of problems, which visual display can be the rate of flashing of the LEDs, the sequence that they are turned on, etc.

Figure 13A:
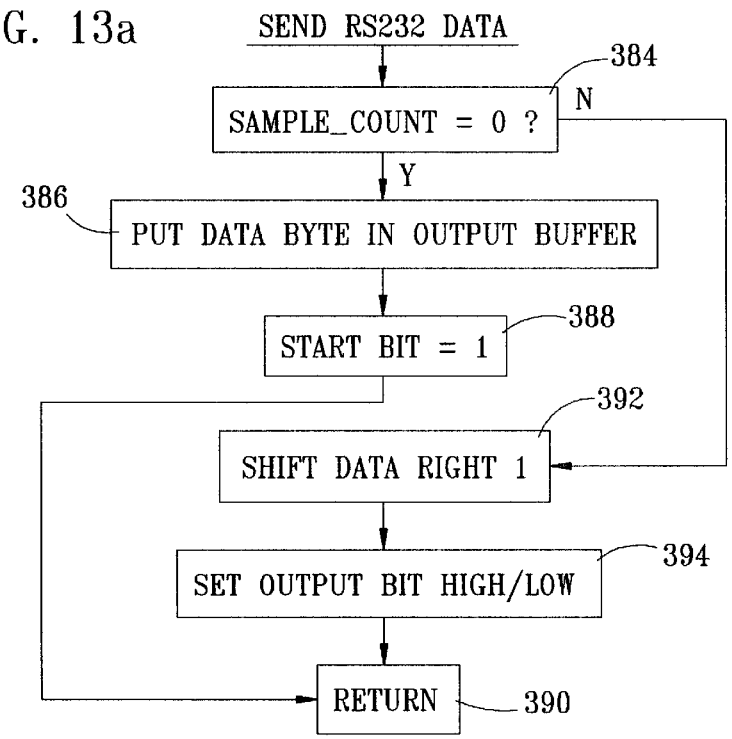
FIGS. 13a and 13b illustrate flowcharts depicting the send and receive operations for the input/output functions.
Figure 13B:
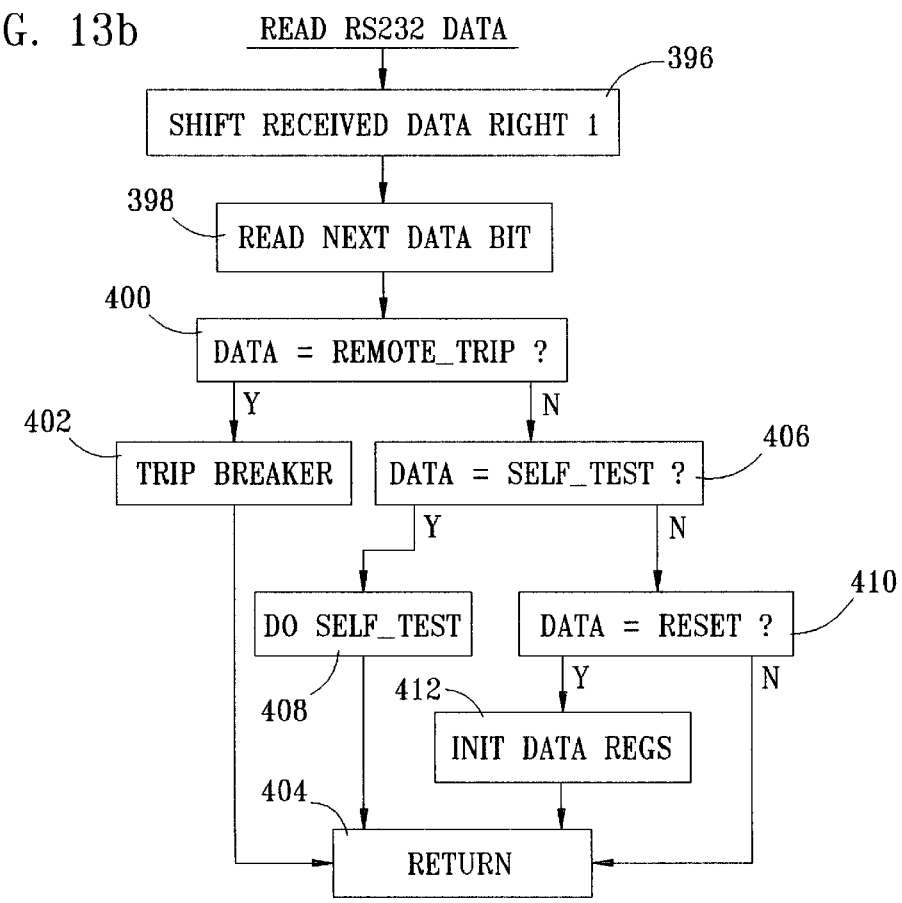

Referring now to FIGS. 13a and 13b, there is illustrated a flowchart depicting the operation of the serial port. FIG. 13a is directed toward the Send operation and is initiated at a decision block 384 that determines if the sample count is equal to "0". If so, the program will flow along a "Y" path to a function block 386 to place a data byte in the output buffer. Since the sample count is equal to "0", this indicates a zero crossing. The program will then flow to a function block 388 to set the Start bit equal to "1" and then flow to a Return block 390. If the sample count is not equal to "0", the program will flow along the "N" path to a function block 392 wherein the data will be shifted to the right by a value of "1". The program will then flow to a function block 394 to set the Output bit to either a "high" or "low" value, and then the program flows to the return block 390.

With specific reference to FIG. 13b, the Read operation is initiated at a function block 396, wherein the received data bit is shifted to the right by a value of "1". The program then flows to a function block 398 to read the next data bit and then to a decision block 400 to determine if the data is set to a remote trip. If so, the program will flow along a "Y" path to a function block 402 wherein the breaker will be tripped in response to receiving this data and then flows to a return block 404. This is a function wherein an external or remote location can transmit to the breaker a tripped signal which will force the trip to occur. However, if the data has not been of a nature of a remote trip, the program will flow along a "N" path to a decision block 406 to determine if the self-test operation has been defined by the data. If so, the program will flow along a "Y" path to a function block 408 to perform the self-test and then to the return block 404. If the self-test command has not been received, the program will flow along a "N" path to a decision block 410 to determine if a reset command has been received. If so, the program will flow along a "Y" path to a function block 412 to initialize the data registers and then to the return block 404. If the reset operation has not been indicated by the received data, the program will flow along a "N" path to the return block 404.

With respect to a Trip operation, this is initiated by the Trip Flag being set to a true condition. There are two ways that a trip can be effected. The first is to immediately trip the breaker by turning on the triac 222. The second is to trip the breaker only at a zero crossing detection. The latter method will prevent current arcing at the contacts. The method is selectable by the user either through uploading of a command or by incorporating an external jumper.

Figure 14:
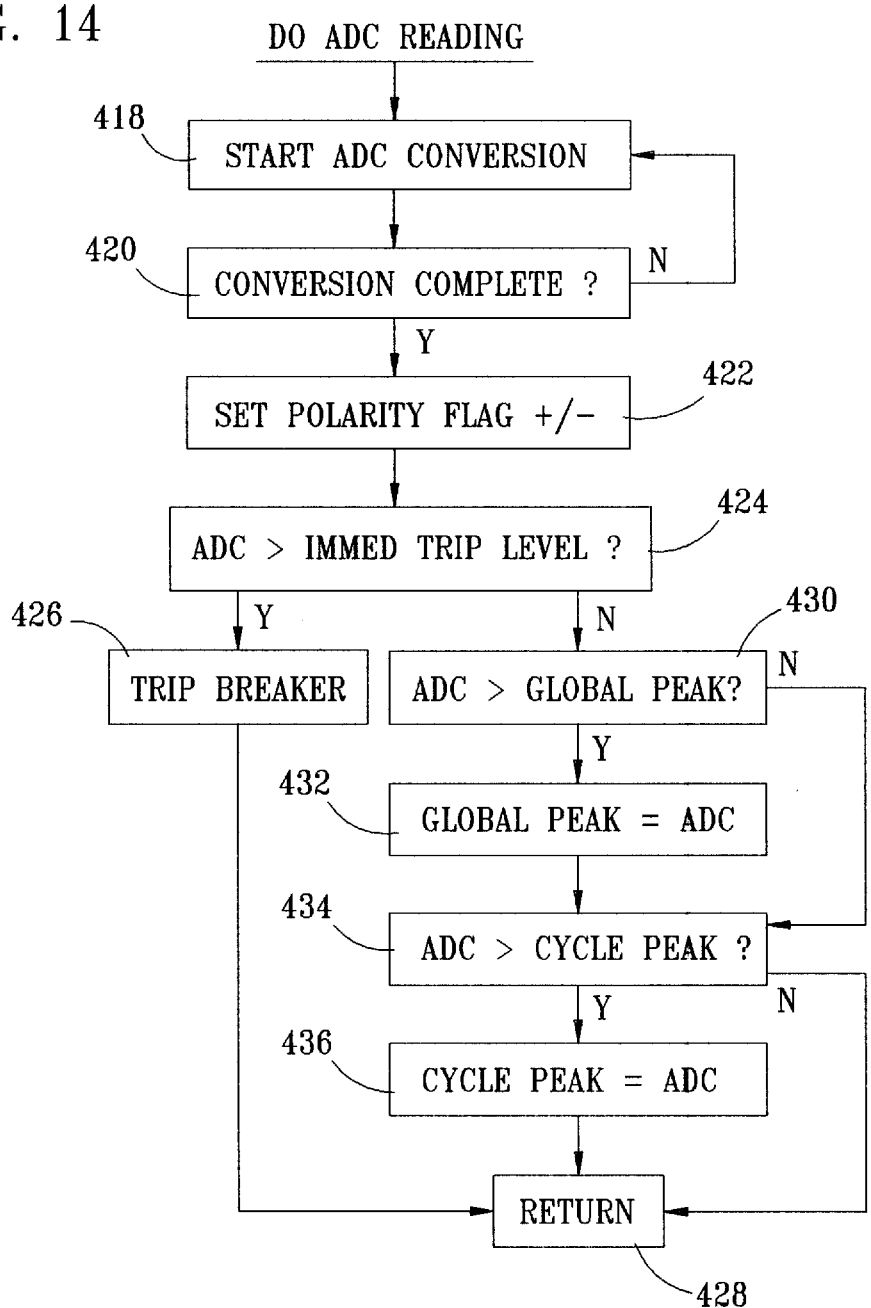
FIG. 14 illustrates a flowchart depicting the conversion operation for detecting current and deriving digital information therefrom.

Referring now to FIG. 14, there is illustrated a flowchart depicting the ADC conversion routine, which is initiated at a function block 418 to initiate the ADC conversion, and then the program flows to a decision block 420 to determine if the conversion is complete. If not complete, the program will loop back to function block 418. When complete, the program flows along the "Y" path to a function block 422 to set the polarity flag at either a"+" or a"–". As noted above, the analog value output by the amplifier 132 is input directly to the CPU 60, which input pin associated therewith is programmed as an analog input. This will result in an eight-bit digital value being generated with an internal analog-to-digital converter. By utilizing a separate input for the sign bit from node 152, the sign of the signal can occupy a 9th bit. Therefore, a 9 bit analog-to-digital converter is realized.

After the polarity flag has been set, the program will flow to a function block 424 to determine if the level of the ADC is greater than the immediate trip level. The immediate trip level is a level that indicates instantaneous excessive current. If so, the program will flow along the "Y" path to a function block 426 to trip the breaker and then to a return block 428. However, if the immediate trip level has not been exceeded, the program will flow along an "N" path to a decision block 430 to determine if the ADC value is greater than the global peak value which was previously stored. If so, the program will flow along a "Y" path to a function block 432 to set the global peak value in the associated register to the current ADC value. The program will then flow from function block 432 to a function block 434, which is also the path that the decision block 430 will make along the "N" path thereof if the ADC value is determined to be less than or equal to the global peak value previously stored.

The decision block 434 determines if the ADC value is greater than the previously stored cycle peak value. The cycle peak value is the peak value for that given cycle. If not, the program will flow along the "N" path to return block 428. If so, the program will flow along the "Y" path to a function block 436 to set the cycle peak current register to the current ADC value. The program will then flow from function block 436 to the return block 428.

Figure 15:
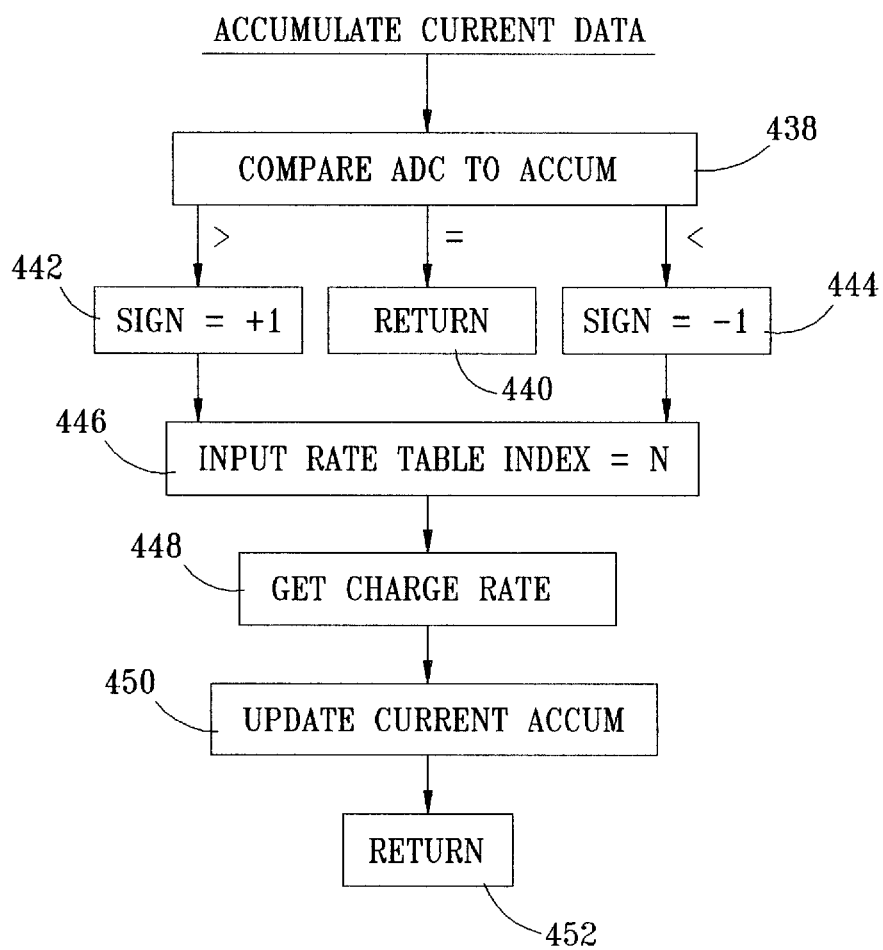
FIG. 15 illustrates a flowchart depicting the current accumulation operation.

Referring now to FIG. 15, there is illustrated a flowchart depicting an operation wherein the current data will be accumulated. This program is initiated at a decision block 438 which will compare the present ADC value to the accumulated value. If it is equal to the accumulated value, the program will flow to a return block 440. If the ADC value is greater than the previous accumulated value, the program will flow to a function block 442 to set the sign equal to a value of "+1". If the ADC value is less than the accumulated value, the program will flow to a function block 444 to set the sign value equal to "–1". The function blocks 442 and 444 will then both flow to a function block 446 to fetch an input rate table index and then flow to a function block 448 to obtain a charge rate. The current accumulator will then be updated, as indicated by a function block 450 and then the program will flow to a return block 452.

In general, the accumulation operation is a method for increasing or decreasing an accumulator value by a predetermined rate, depending upon whether the present value of the current is above the previous accumulated value or below the accumulated value. The rate value is provided such that a sharp increase in current between two samples will not replace the previous accumulated value with the present value of the current but, rather, will increase it by a predetermined factor. This, in a sense, is a digital filter that is analogous to a software RC circuit. This digital filter will effectively smooth out any transients that are due to high current peaks and such. Therefore, instantaneous transients that do not result in a great deal of energy placed into the load or through the breaker will not cause the breaker to trip.

Figure 16:
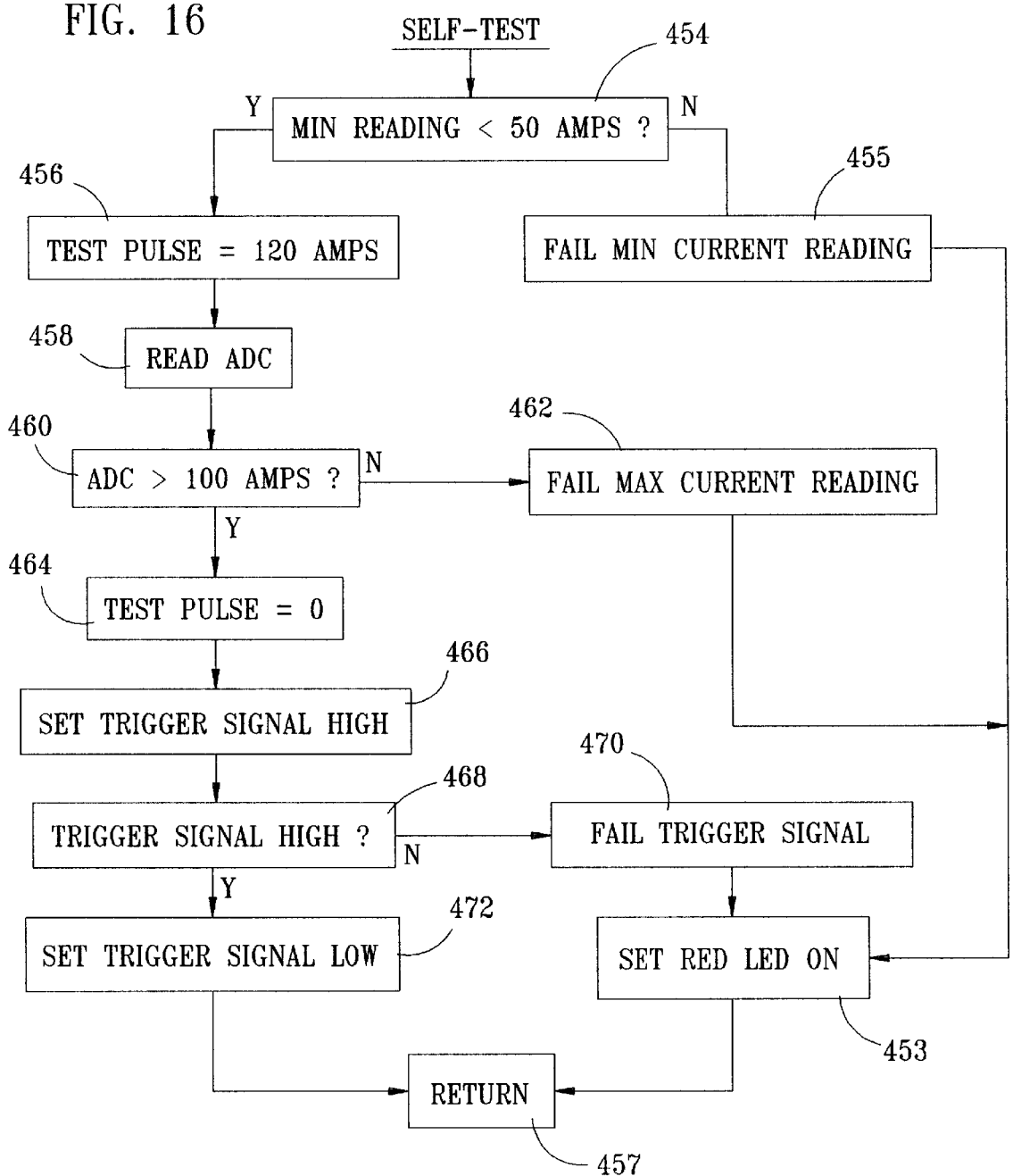
FIG. 16 illustrates a flowchart depicting self-test operations.

Referring now to FIG. 16, there is illustrated a flowchart depicting the self-test operation, which is initiated at a decision block 454 that determines whether the minimum current reading is less than 50 amps. If not, the program will flow along a "N" path to a function block 455 indicating that the minimum current reading has failed and then to a function block 453 to set the red LED to an on condition and then to a return block 457. However, if the minimum current reading is less than 50 amps, the program will flow along a "Y" path to the decision block 454 to a function block 456 to generate the test pulse for a current equivalent to approximately 120 amps. The program will then flow to a function block 458 to read the current ADC value and then to a decision block 460 to determine if the ADC value is greater than 100 amps. If not, this indicates a failure and the program will flow to a function block 462 indicating a maximum current reading failure and then to the function block 453 to set the red LED to an on condition. However, if the 100 amp test has been passed, i.e., the current was read to be greater than 100 amps, the program will flow along the "Y" path to a function block 464 to set the test pulse equal to "0", i.e., take it low. The program will then flow to a function block 466 to set the trigger signal high, which trigger signal is the gate control signal for the triac 212 and then flows to a decision block 468 to determine if the trigger signal is high. If not, the program will flow to a function block 470 to indicate a failure of the trigger signal and then to the function block 453 to set the red LED to an on condition. If the trigger signal is indicated as being high, the program will flow from decision block 468 along the "Y" path thereof to a function block 472 in order to again set the trigger signal to a low condition. The time between the trigger signal going high and the trigger signal going low is a very small amount of time which will not raise the node 214 high, due to the fact that the capacitor 220 cannot charge up through resistor 216. Therefore, the triac 212 will not be turned on. The program will then flow from function block 472 to the return block 457.

Figure 17:
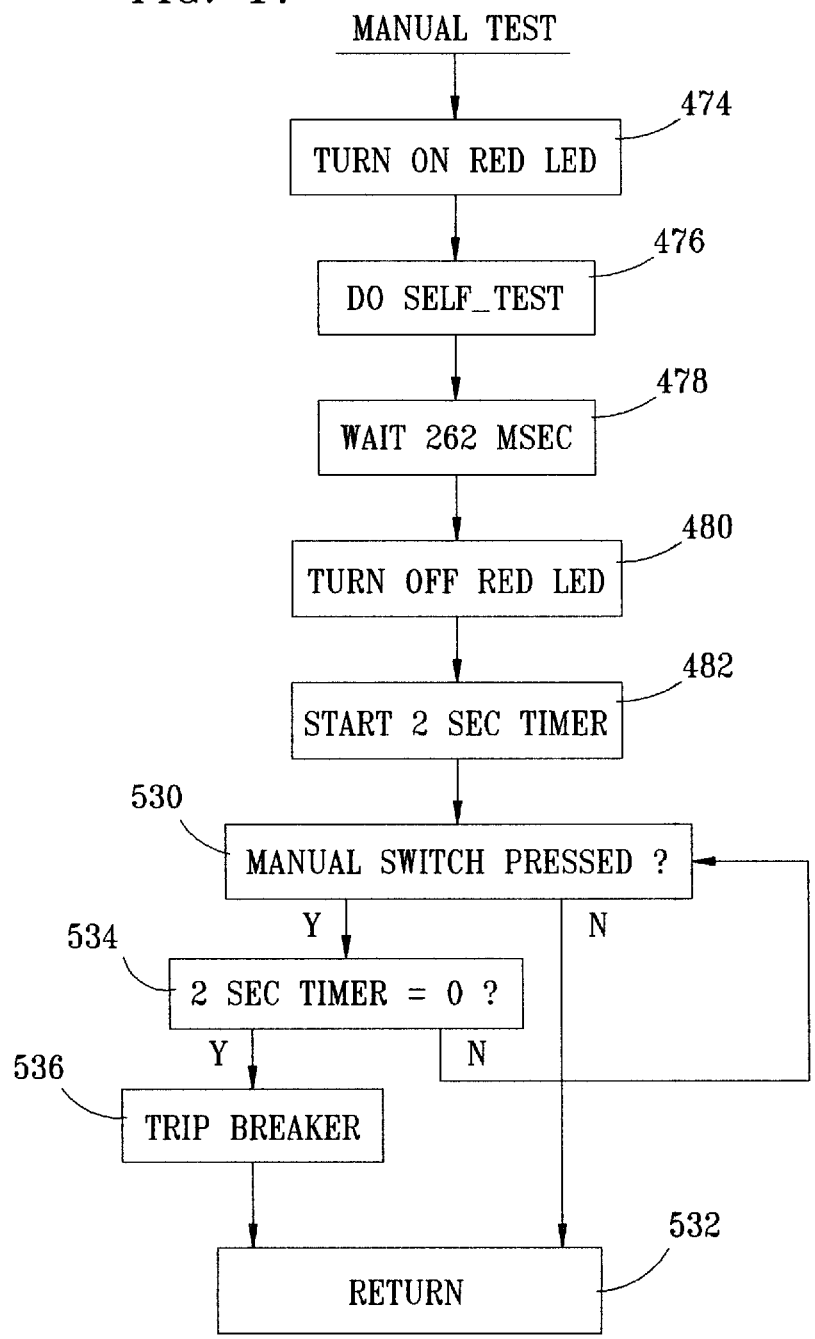
FIG. 17 illustrates a flowchart depicting a manual test operation.

Referring now to FIG. 17, there is illustrated a flowchart depicting the manual test operation, which is initiated at a function block 474 to turn the red LED on and then to a function block 476 to perform a self-test. The program then flows to a function block 478 to wait for 262 msec, after which time the red LED is turned off, as indicated by a function block 480. The program then flows to a function block 482 to start the two-second timer and then to a decision block 530 to determine if the manual test switch has been pressed. If it has not been pressed, the program will flow along a "N" path to a return block 532. However, if the manual test switch has been pressed, the program will flow along the "Y" path to a decision block 534 to determine if the two-second timer is equal to "0". If not, the program will loop back around the "N" path to decision block 530. When it has timed out, the program will flow along the "Y" path to a function block 536 to trip the breaker and then to the return block 532.

Figure 18:
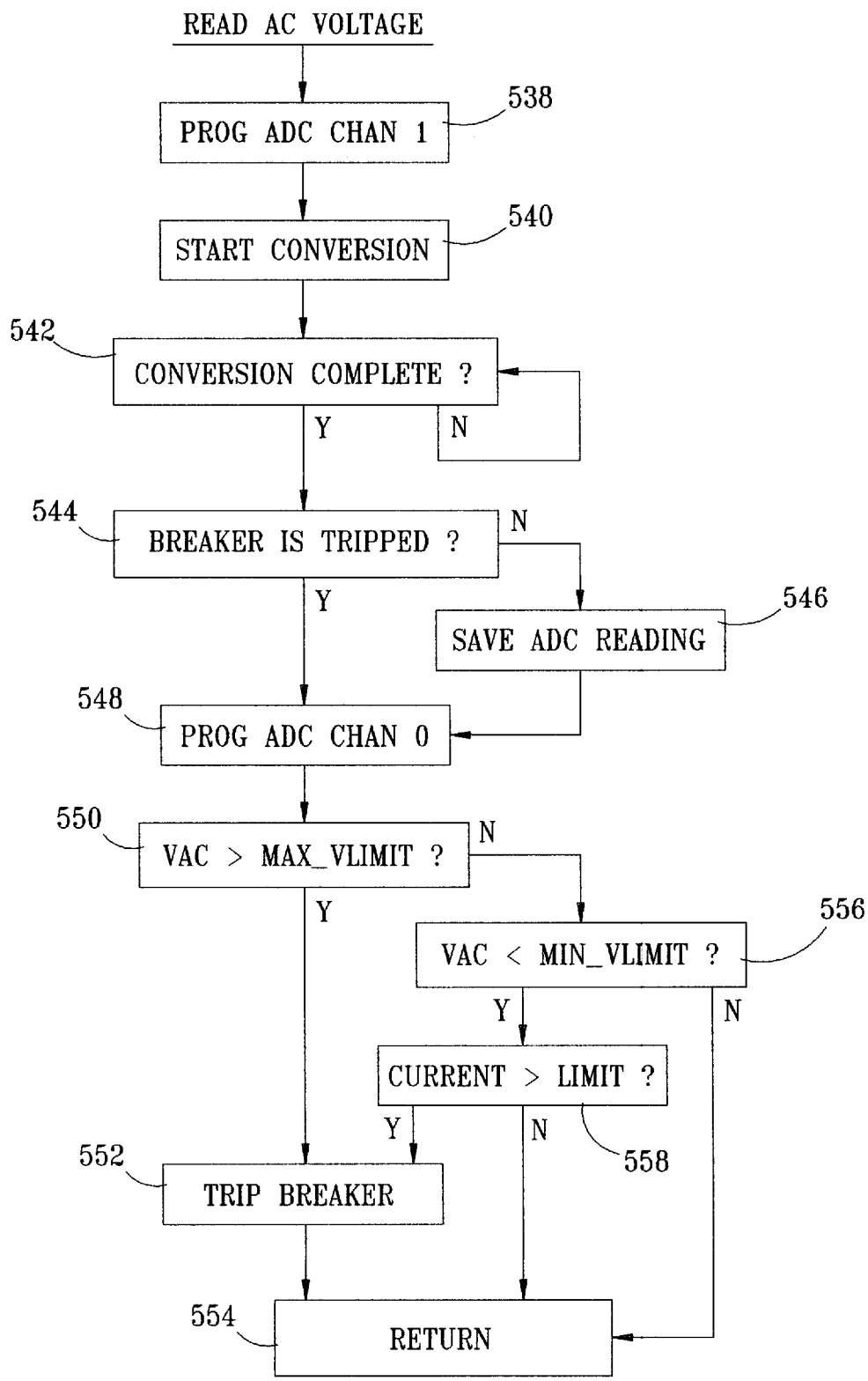
FIG. 18 illustrates a flowchart depicting the operation of reading the AC line voltage.

Referring now to FIG. 18, there is illustrated a flowchart depicting the operation for reading the AC voltage, which is initiated at a function block 538 wherein the two voltage inputs, which are multiplexed, are selected such that channel 1 constitutes the node 204 that measures the voltage on node 194 on the opposite side of the solenoid 16 from the load terminal 14. The program will then flow to a function block 540 to initiate the conversion and then to a decision block 542 to determine if the conversion is complete. If not complete, it loops back upon itself and, if complete, the program flows to a function block 544 to determine if the breaker is tripped. If not tripped, the program flows along a "N" path to a function block 546 to save the ADC reading. The program then flows to a function block 548 to select the other voltage input. If the breaker is tripped, the program will flow along a "Y" path from decision block 544 to function block 548.

The channel 1 operation performs a conversion, as noted above with respect to block 540 and 542, and then flows to a function block 550 to determine if the AC voltage is greater than the maximum voltage limit MAX_VLIMIT. If so, the program will flow along a "Y" path to a function block 552 to trip the breaker and then to a return block 554. If the AC voltage does not exceed the maximum voltage, the program will flow along the "N" path from decision block 550 to a decision block 556 to determine if the AC voltage is less than the minimum voltage limit MIN_VLIMIT. If the AC voltage is greater than the minimum voltage limit, the program will flow along a "N" path to the return block 554. If the voltage is less than the minimum voltage limit, the program will flow along a "Y" path to a decision block 558 to determine if the current is greater than a predetermined current limit. If not, the program will flow along a "N" path to the return block 554. If the current does exceed the predetermined current limit, the program will flow along a "Y" path from decision block 558 to the function block 552 in order to trip the breaker.

Figure 19:
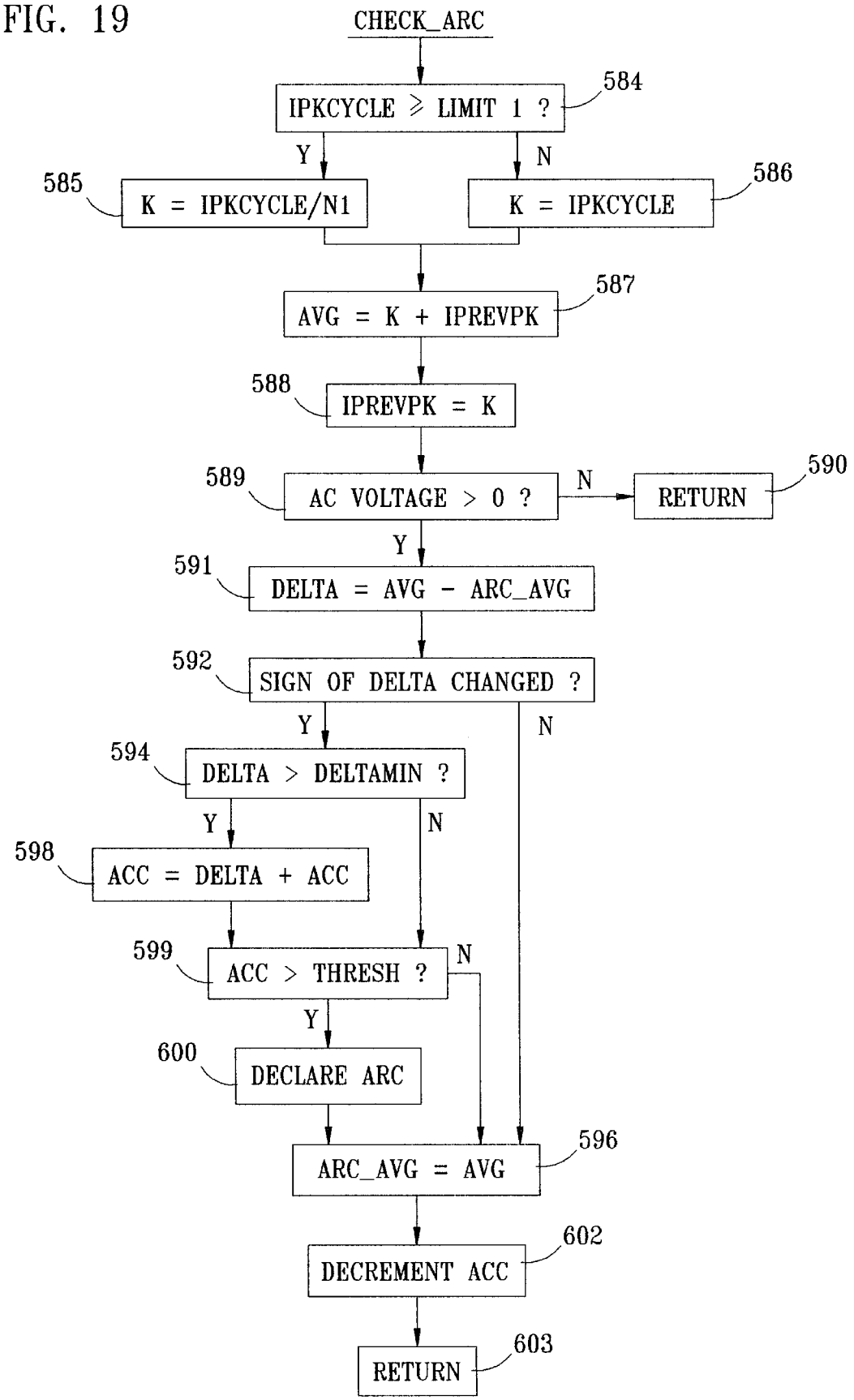
FIG. 19 illustrates a flowchart depicting the arc detection algorithm.

Referring now to FIG. 19, there is illustrated a flowchart depicting the arc detection algorithm. Arc generation is, in general, an intermittent operation wherein current is momentarily interrupted for either one half of a cycle or multiple cycles. This interruption can be in the form of a total interruption of current or a momentary decrease in current due to the resistive nature of the discontinuity in the wire. The technique for detecting the arc in the present invention is to sample the peak current during the positive half of the cycle and sample the peak current during the negative half of each cycle. For each cycle, the positive peak current and the absolute value of the negative current are added together and divided by two to provide the average thereof. This average is compared with the average of the previous cycle and the difference therebetween compared to a threshold. If this difference exceeds the threshold, this constitutes an arc. Rather than declare that an arc is present based on a single cycle, the differences are accumulated for a number of cycles and, if the differences have accumulated to a value that exceeds a predetermined threshold, then an arc is declared to be present. Of course, after a predetermined period of time, this will be reset and the sequence initiated again.

Referring further to the flowchart of FIG. 19, the operation is initiated at a decision block 584 to determine if the peak current term for a given half of a cycle IPKCYCLE is greater than or equal to the first limit. If yes, the program proceeds to a function block 585 and, if no, the program flows to a function block 586. Function block 585 sets a value of "K" to the peak cycle value divided by the factor "N1", and the function block 586 sets the value of K equal to the value of the peak cycle. The program then flows to a function block 587 to set the average value equal to the value of K plus the previous peak value. The program then flows to a function block 588 to set the previous peak value set to the value of K. The program then flows to a function block 589 to determine if the AC voltage is greater than zero. If not, the program flows to return block 590 and, if so, the program flows to a function block 591. Function block 591 sets a DELTA value equal to the average value AVG minus the average arc value ARC_AVG. The program then flows to a decision block 592 to determine if the sign of the value of DELTA has changed. If so, the program then flows along a "Y" path to a decision block 594 and, if not, the program flows along an "N" path to a function block 596. At decision block 594, a determination is made as to whether the value of DELTA is greater than a minimum DELTAMIN. If so, the program flows along a "Y" path to a function block 598 to set an accumulator value ACC equal to the value of DELTA plus the previous accumulator value. The program then flows to a decision block 599, this being the path from function block 594 along the "N" path thereof. Decision block 599 determines whether the accumulator value is greater than a predetermined threshold value. If so, the program will flow to a function block 600 along the "Y" path thereof to declare an arc and then to function block 596. If the accumulated value is not greater than the threshold, the program would flow from decision block 599 along the "N" path thereof to the function block 596.

If, at the decision block 592, the decision had been a negative decision, i.e., the DELTA sign had not changed, the program would flow to the function block 596 to set the ARC_AVG value equal to the AVG value. The program then flows to a function block 602 to decrement the accumulator value and then to a return block 603.

The function blocks 585 and 586 basically determine if the current has exceeded a limit and, if so, function block 585 will provide an attenuation factor thereto. The function block 587 determines the average as the average current of the last negative peak and the immediately preceding positive peak. The function block 589 determines whether the AC voltage is greater than zero, which operation is performed typically on positive peaks and low-to-moderate currents. The path of decision block 594 and function block 598 is the accumulation operation wherein the DELTA value between two successive cycles is determined to be greater than a predetermined minimum and, if so, this is added to an accumulator value. The function block 602 is a decrement function that prevents the accumulator from continuing to grow in value. If there are no arcs present, the value in the accumulator will slowly decline. The program associated with the flowchart of FIG. 19 is as follows:

ARC DETECTION ALGORITHM:

```
Check_ARC( )
{ //10
        byte avg, delta_i, k;                       // temporary local variables.
        IF(IPKCYCLE>= 16) k = IPKCYCLE/4 + 12;
        else k = IPKCYCLE;
        avg = k + IPREVPK;                          // present average current of the last positive
                                                    // peak and the negative peak before that.
        IPREVPK = k;                                // save the present peak value.
        if( VOLTS_AC > 0)                           // do this only on positive peaks
                                                    // (60 time per second).
    { //20
            delta_i = avg - ARC_AVG;                // is new average significantly different
                                                    // from the previous average and is the
                                                    // sign different?
            if(( delta_i>0) && (LAST_SIGN==0)||     // positive now, was negative
               (delta_i<0) && (LAST_SIGN==1))       // negative now, was positive
            { //30                                  // then signs are different.
               delta_i = abs(delta_i);              // make delta_i positive so we can add it
                                                    // to the ARC_ACCUM.
               if(delta_i>ARC_MIN)                  // is the difference significant?
               { //40
               LAST SIGN = !LAST_SIGN;              // complement the sign flag.
               if(delta_i<8)delta_i = 8;            // 8 amps min
               ARC_ACCUM = ARC_ACCUM + delta_i;
                                                    // this looks like an arc.
            if(ARC_ACCUM>255)&&((MODE & 0x04)!=x04)
                                          Do_trip;  // trip the breaker on overflow.
            } //40
        } //30
        ARC_AVG = avg;                              // update the average current.
        if (ARC_ACCUM> MAX_ARC)
            MAX_ARC = ARC_ACCUM:                    // Max during the logging
                                                    // interval.
        if (ARC_ACCUM > 0)
            ARC_ACCUM = ARC_ACCUM-1;                // decrement the arc accumulator
                                                    // on every whole cycle (60x per second)
        } //20
} //10 end
```

Figure 20:
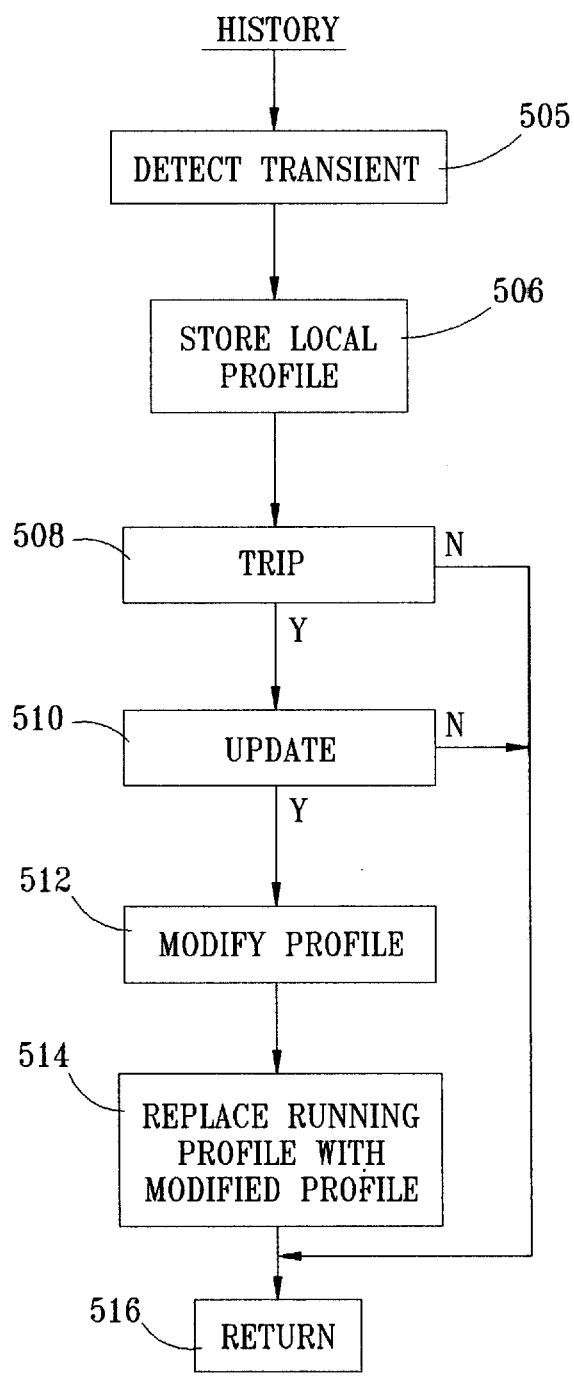
FIG. 20 illustrates a flowchart depicting the adaptive aspect of the profile updating.

Referring now to FIG. 20, there is illustrated a flowchart depicting the operation wherein the system can operate in an adaptive manner to update the profile. The program is initiated at a function block 505 and then to detect a transient. In general, whenever a steady load is present, this will not cause the system to trip. However, when a transient occurs due to a change in load as a result of either turning an appliance on or varying the load of an appliance, this will result in a transient. This is detected and then the program will flow to a function block 506 to store the local profile without this transient. The local profile basically defines a current versus time profile about the transient. The program will then flow to a decision block 508 to determine if a trip has been declared by the circuit as a result of the current due to the transient exceeding the current in the pre-stored profile which is referred to as a "running" profile. If the trip operation has occurred as a result of the current exceeding that defined by the running profile, the program will flow to a decision block 510 to determine if an update operation should be performed. An update operation is a procedure which can be manually or remotely initiated and is a result of a user determining that the trip was improper, i.e., the load was operating in an expected manner and the trip was in error. If an update operation is to be performed, the program will flow along a "Y" path to a function block 512 wherein the stored profile about the transient will be modified by incrementing the current value by, for example, 10% over the appropriate time frame. This new modified profile will then replace the running profile, as indicated by a function block 514. This replacement with the modified profile provides an adaptive system which, although not shown, could be automated wherein a known load is placed on the system with the actual trip operation being prevented until the modified profile has been stored. For each trip indication, but not actual trip, a modified profile is generated and stored. This will continue until subsequent transients result in no generation of a trip. Thereafter, the system can be placed in a "run" mode, wherein a transient exceeding the running profile will cause an actual trip. An alternative method is to utilize an external system for generating the profile and then downloading the generated profile into memory in CPU 60.

Figure 21:
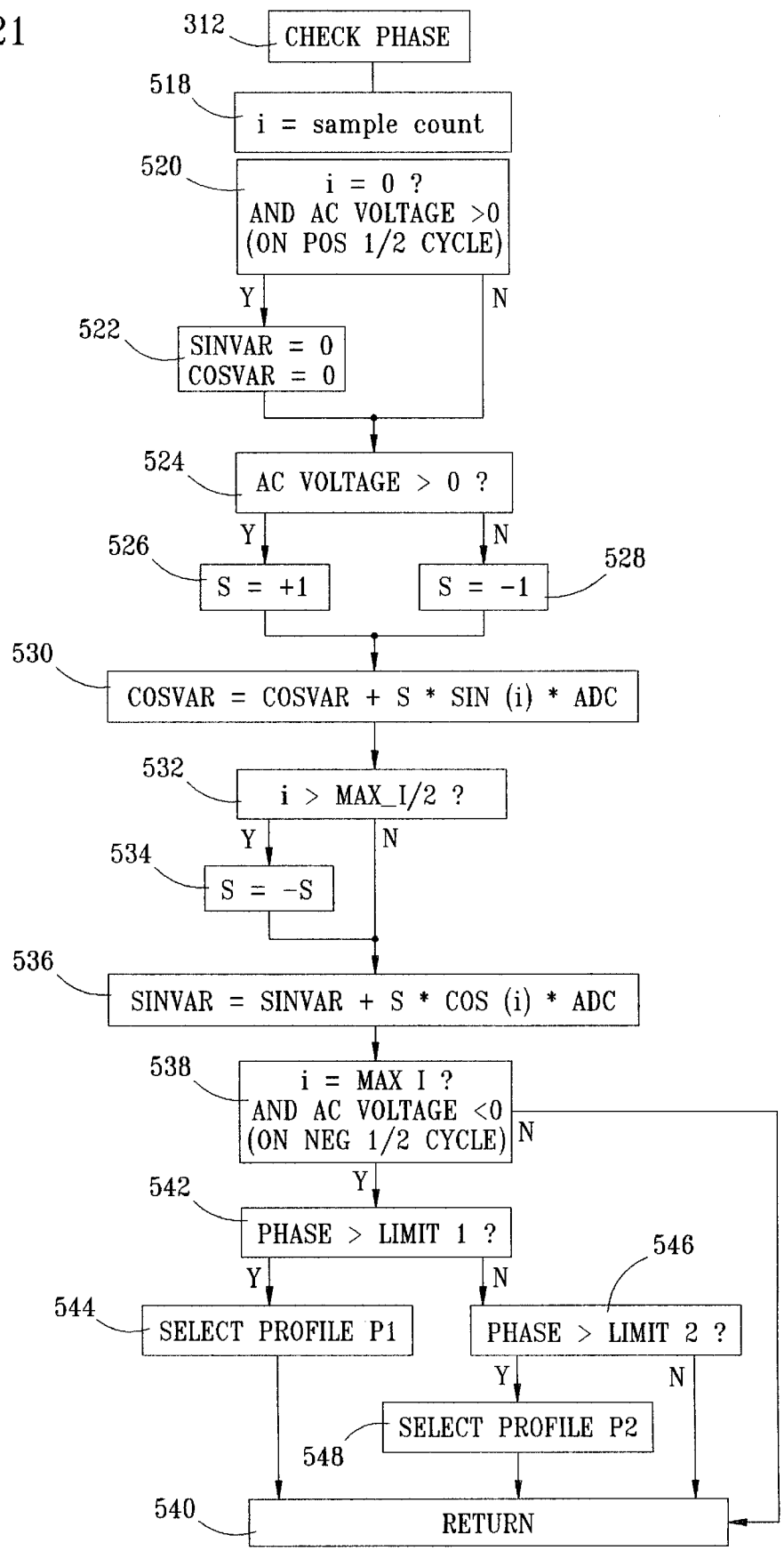
FIG. 21 illustrates a flowchart depicting the operation of determining the phase.

Referring now to FIG. 21, there is illustrated a flowchart depicting the operation of the Check Phase block 312 of FIG. 10. This routine determines the sine and cosine of the fundamental Fourier component of the load current. This includes both amplitude and phase information. The program is initiated at a function block 518 to set the value of "I" to the sample count. The program then flows to a decision block 520 to determine if the value of "I" is equal to zero and the AC voltage is positive. If not, the program flows to a function block 522 in order to set the value of SINVAR and COSVAR to zero at the zero crossing of the positive going portion of the cycle. If not, the program will flow to a decision block 524, the function block 522 also flowing to the decision block 524. The decision block 524 determines whether the AC voltage is greater than zero. If so, the program flows to function block 526 to set the sign value to "+1" and if not, the program flows along an "N" path to function block 528 to set the sign value to "−1". The function blocks 526 and 528 will then flow to a function block 530 to calculate the following equation:

$$COSVAR = COSVAR + S*\sin(i)*ADC$$

The values of sin(I) and cos(I) are obtained through a lookup table.

The program then flows from function block 530 to a function block 532 in order to determine if the value of "1" is greater than one-half the maximum count. At present, the maximum count is set to fifteen, but it might be larger in future embodiments. If so, the program flows along the "Y" path to a function block 534 to invert the sign value and, if not, the program flows directly to a function block 536. Function block 534 also flows to function block 536. The equation in function block 536 is as follows:

$$SINVAR = SINVAR + S * \cos(i) * ADC$$

The program then flows from function block 532 to a function block 538 to determine if the value of "I" is equal to the maximum count and the AC voltage is negative. If not, the program will flow to a return block 540 to return to function block 314. If so, the program will flow from function block 542 to determine if the phase angle is greater than a first phase angle limit. If so, the program will flow along a "Y" path to a function block 544 to select a profile "P1", and then to the return block 540. However, if the phase is not greater than the first phase angle limit, the program will flow to a decision block 546 to determine if the phase angle is greater than a second phase angle limit. If it is not, the program will flow to the return block 540 and, if so, it will flow to a function block 548 to select the profile "P2", and then to the return block 540. The flowchart of FIG. 21 is processed through once for each sample, such that the ADC must take another sample and increment the value of "I" for the next pass.

It can be seen from the flowchart of FIG. 21 that a determination is made as to the characteristics of the load or as to the type of load. This determination is made by examining the voltage of the line and the current supplied to the load. With these parameters, it is possible to calculate some characteristics of the load, i.e., the phase angle in the present case. This then allows a particular profile to be selected that is more desirable for the particular condition with that load. As such, there has been an automatic "on-the-fly" configuration of the circuit breaker. This is done without intervention of the user, such that only the parameters of the load are required in order to select the manner in which the circuit breaker will trip.

Figure 22:
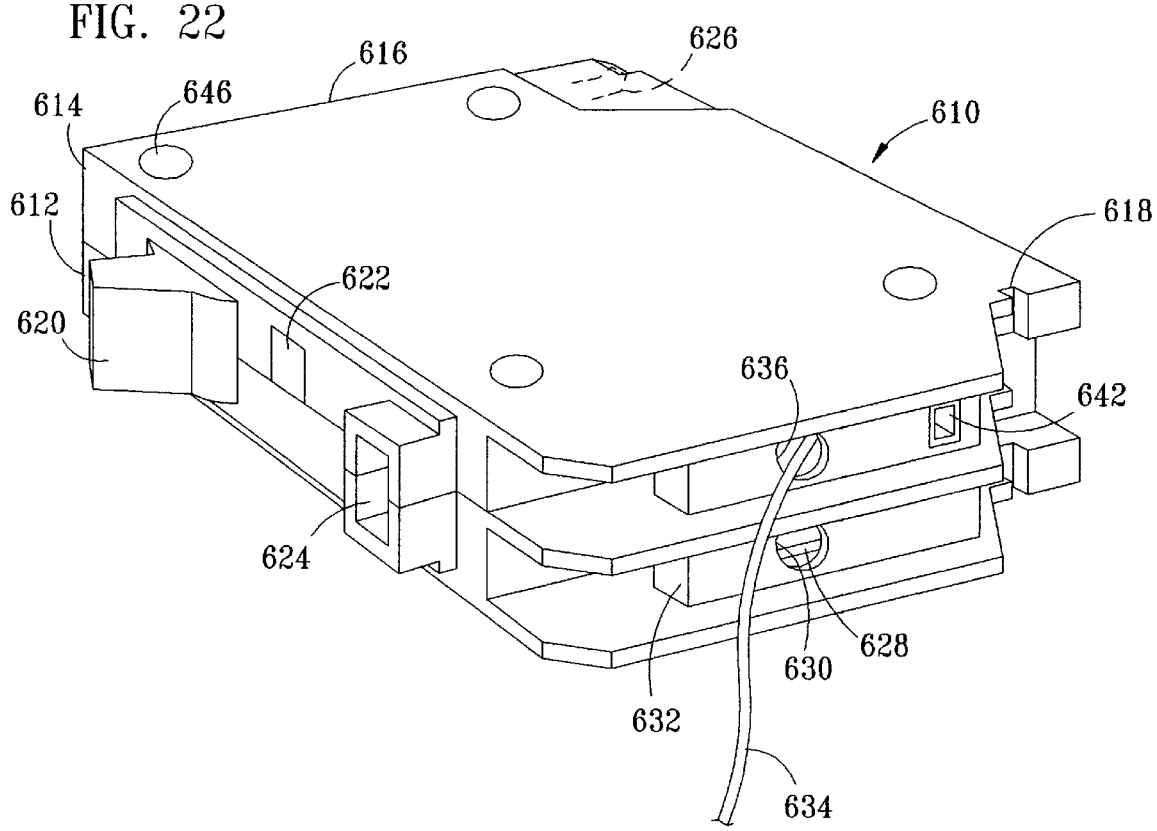
FIG. 22 illustrates a perspective view of the digitally enhanced circuit breaker of the preferred embodiment of the present invention.

Referring now to FIG. 22, there is illustrated a perspective view of a digitally enhanced circuit breaker 610 of the present invention. The circuit breaker 610 includes a lower half 612 which provides a standard type of contact section and an upper half 614 which provides a control section. A housing 616 is provided by a plastic case which encloses the contact section 612 and the control section 614 of the circuit breaker 610. The housing 616 has a notch 618 by which the circuit breaker. 610 is secured within a power panel. The circuit breaker 610 includes a single throw and reset switch lever 620 which is used to push the primary power contacts of the circuit breaker 610 together and to reset the circuit breaker 610 after it has been tripped. A test button 624 is also provided for testing operation of circuit breaker 610.

A clip-on electrical connector 626 is provided for connecting the circuit breaker 610 onto a power bus of a power panel within which circuit breaker 610 is installed. A terminal connector 628 is provided for connecting an output power conductor to the circuit breaker 610. The terminal connector 628 is preferably of the type having a tightening screw to secure the output power conductor therein. However, the breaker does not have to have a tightening screw. Some breakers are designed to be used with solid wire that pushes into a contact receptacle. A tightening port 632 is provided to allow access to turn the tightening screw for securing a power conductor to the terminal connector 628. The output power conductor will pass through an open end 630 of the housing 616. The circuit breaker 610 further includes a neutral lead wire 634 which passes through a port 636. The circuit breaker 610 also includes a serial I/O port 642. The serial I/O port 642 includes a 4-conductor wire assembly 640 and a female connector 642. The 4-pin female connector 642 is preferably of the type commonly used for telephone handset connectors. Screw fasteners 646 are provided for securing the components of the housing 616 around the contact section 612 and the control section 614 of the circuit breaker 610.

Figure 23:
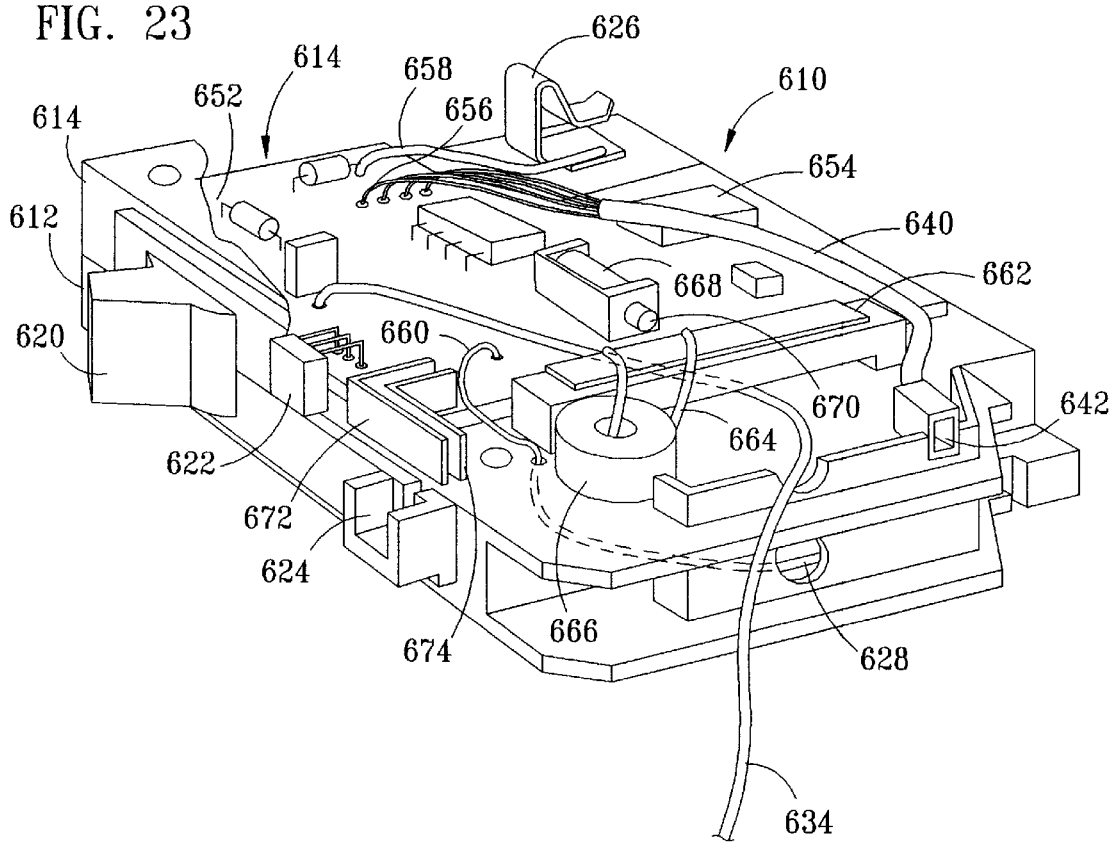
FIG. 23 illustrates a perspective view of the digitally enhanced circuit breaker of the preferred embodiment of the present invention, after a protective cover has been removed to expose the control section.

Referring now to FIG. 23, there is illustrated a perspective view of the circuit breaker 610 after an upper portion of the housing 616 has been removed to expose the control section 614. The control section 614 includes a circuit board 652. It should be noted that the circuit board 652 is mounted within the standard housing 616 of a standard type ground fault circuit breaker, which has been modified to accept the circuit board 652. The circuit board 652 includes a CPU 654 which provides microprocessor control of the circuit breaker 610. Four terminals 656 are provided on the circuit board 652 for mounting the terminal ends of the four conductor wires of assembly 640 of the serial I/O port 642 to the circuit board 652. A lead wire 658 is soldered between the clip-on connector 626 and the circuit board 652. A lead wire 660 extends between and electrically connects the circuit board 652 to the terminal connector 628.

A bus bar 662 is mounted within the housing 616, connected in series between the power output of the contact section 612 and the terminal connector 628. The electrical current passing through the circuit breaker 610 is passed directly through the bus bar 662 in passing from the contact section 612 to the terminal connector 628. One end of the bus bar 662 is electrically connected to the contact section 612 by a first lead wire (not shown) and the other end is connected to the terminal connector 628 by a second lead wire (not shown). A lead wire 664 has two terminal ends which are soldered to the bus bar 652, preferably spaced seven (7) millimeters. The lead wire 664 provides a single loop for passing through a toroidal coil 666. The toroidal coil 666 preferably has one thousand (1,000) turnings. Opposite terminal ends of the toroidal coil 666 are connected to the circuit board 652 by two lead wires (not shown). The output from the toroidal coil 666 is connected to the circuit board 652 for sensing the current passing through the bus bar 652 and the circuit breaker 610.

A solenoid 668 is mounted to the circuit board 652 and is selectively activated to move a lever 670 to trip the circuit breaker 610 when a fault is detected by the CPU 654. Activation of the solenoid 668 will move the lever 670 toward the bus bar 662, which will trip the circuit breaker 610 to open the power contacts of contact section 612. A test contact 672 and a test contact 674 are both mounted to the circuit board 652, and have ends which are spaced apart and extend in parallel. Pressing the test button 624 into the housing 616 will push the contact 672 into the contact 674, making an electrical connection therebetween and causing a self-test cycle to be initiated.

Although the preferred embodiment has been described in detail, it should be understood that various changes, substitutions and alterations can be made therein without departing from the spirit and scope of the invention as defined by the appended claims.

What is claimed is:

1. An intelligent circuit breaker for controlling the current flow from an AC main to a load, which circuit breaker has a series breaker element that can be controlled by a generated control signal to control current flow to the load through the series breaker element, comprising:
   a parameter sensor for sensing the parameters of the circuit breaker relating to current flowing through the circuit breaker from the AC main to the load;
   a storage device for storing predetermined performance parameters for desired relationships between the current and the load that define acceptable operating current constraints of the load, wherein said acceptable operating current constraints vary with time according to the load that is associated with the series breaker element at a given time; and
   a controller for comparing the sensed parameters detected by said parameter sensor to said stored predetermined performance parameters and generating said control signal when the sensed parameters fall outside of said acceptable operating current constraints.

2. The circuit breaker of claim 1, and further comprising an input/output port for communicating with said controller from an external location to said circuit breaker to allow information to be transmitted to said controller and information to be transmitted from said controller to said external location.

3. The circuit breaker of claim 2, wherein said controller is operable to receive from said input/output port new desired relationships for storage in said storage device.

4. The circuit breaker of claim 2, wherein command information is transmitted from said external location to said controller to override the operation of said controller and cause said controller to generate said control signal in response to receiving said command information.

5. The circuit breaker of claim 1, wherein said parameter sensor includes a current sensor for sensing the level of AC current supplied to the load.

6. The circuit breaker of claim 5, wherein the circuit breaker includes a bus line for carrying current from the series breaker element to the load and said current sensor comprises:
   a toroidal core;
   secondary winding wound on said toroidal core;
   a primary winding wound on said toroidal core, said primary winding having two ends, said two ends disposed on the bus a predetermined distance apart, such that a portion of the current is routed through said primary winding; and
   said secondary winding operable to translate the current level down to a measurable level, the current output thereof providing the sensed current.

7. The circuit breaker of claim 5, wherein the desired relationships include a maximum current level, such that whenever the sensed current exceeds the maximum current level, the control signal is immediately generated by said controller to interrupt current with the series breaker element.

8. The circuit breaker of claim 5, and further comprising a current zero crossing detector for determining when the sensed current makes a transition from a positive to a negative value and goes through a zero value.

9. The circuit breaker of claim 8, wherein said controller is operable to generate said control signal only when the current is determined to be proximate to a zero value.

10. The circuit breaker of claim 8, and further comprising a voltage sensor for sensing voltage on the load side of the series breaker element.

11. The circuit breaker of claim 10, and further comprising a voltage zero crossing detector for determining when the voltage passes from between positive and negative values and a substantially zero value and a phase detector for determining the phase angle between the sensed voltage at the zero crossing point thereof and the sensed current at the zero crossing point thereof.

12. The circuit breaker of claim 11, and further comprising a load detection device for determining the type of load that is present as a function of the determined phase angle.

13. The circuit breaker of claim 12, wherein said storage device is operable to store as the desired relationships a plurality of different, distinct, desired relationships and further comprising a selection device for selecting one of the desired and distinct relationships as a function of the type of determined load after determination thereof by said determination device.

14. The circuit breaker of claim 1, wherein said storage device is operable to store a plurality of predetermined performance parameters, each being distinct and associated with distinct ones of the desired relationships between the current and the load that define distinct, acceptable operating current constraints.

15. The circuit breaker of claim 14, wherein said plurality of predetermined performance parameters are each selectable.

16. The circuit breaker of claim 15, wherein said predetermined parameters are selectable by a user to effect operation of the circuit breaker.

17. The circuit breaker of claim 15, wherein each of said plurality of predetermined performance parameters are selectable as a function of parameters of the current flow to the load as determined by said parameter sensor.

18. The circuit breaker of claim 14, wherein said controller generates said control signal which is operable to cause the series breaker element to discontinue current to the load to thereby constitute a trip operation.

19. The circuit breaker of claim 18, wherein said parameter sensor includes a current sensor for sensing the current flow to the load from the series breaker element.

20. The circuit breaker of claim 19, wherein select ones of said plurality of parameters comprise a relationship of current versus time to define trip point constraints as a function of time that are points above which said controller will generate said control signal to trip said series breaker element, which relationships are defined as trip point profiles.

21. The circuit breaker of claim 20, wherein each of said trip point profiles are selectable with a selection device.

22. The circuit breaker of claim 21, wherein said trip point profiles are selectable by said selection device automatically as a function of parameters of the circuit breaker sensed by said parameter sensor.

23. The circuit breaker of claim 22, wherein said automatic sensing by said selection device is performed upon determining that a start-up condition has occurred, said selection occurring for a predetermined amount of time.

24. The circuit breaker of claim 21, wherein said selection device is operated by said user prior to installation of the circuit breaker.

25. The circuit breaker of claim 20, wherein each of said trip point profiles is a learned trip point profile and further comprising means for learning said trip point profiles.

26. The circuit breaker of claim 1, wherein said parameter sensor includes a voltage sensor for sensing the voltage on the load side of the series breaker element.

27. The circuit breaker of claim 26, wherein the series breaker element includes a series switch that can interrupt current flow from AC mains to the load, which said series switch is controlled by a solenoid, which said solenoid includes a solenoid switch for connecting a solenoid driving coil in said solenoid between the low side of said series switch and the neutral side of the AC mains, which solenoid switch is controlled by said generated control signal, and further comprising a solenoid voltage detector for detecting the voltage on the opposite side of said solenoid driving coil to the load side of said series switch, such that said voltage on the opposite side of said solenoid driving coil on said solenoid opposite to the low side of said series switch can be detected to determine if said solenoid driving coil is operating.

28. An intelligent circuit breaker for detecting arcs in a line, which circuit breaker is operable to modify the current supplied to the load in response to receiving a generated control signal, comprising:
  a current sensor for detecting the AC current waveform for current flowing to a load disposed on the line;
  a peak detector for measuring current at the substantially peak level thereof for a substantially complete cycle of the present AC waveform to provide a present detected value;
  a comparator for comparing the present detected value with the detected value for the previous cycle and generating a true result when a predetermined number of comparisons exhibit a predetermined imbalance; and
  a control circuit for generating the control signal when a true result is output by said comparator.

29. The circuit breaker of claim 28, wherein the circuit breaker is operable to interrupt current in response to generation of the control signal.

30. The circuit breaker of claim 28, wherein said predetermined imbalance occurs whenever the absolute difference of current magnitudes between adjacent cycles exceeds a predetermined value.

31. A method for controlling the current flow from an AC main to a load with a circuit breaker, the circuit breaker having a series breaker element associated therewith that can be controlled by a generated control signal to control current flow to the load through the breaker element, comprising the steps of:
  sensing the parameters of the circuit breaker with a parameter sensor relating to current flowing through the circuit breaker from the AC main to the load;
  storing in a storage device predetermined performance parameters for desired relationships between the current and the load that define acceptable operating current constraints of the load;
  selecting various ones of the predetermined performance parameters for varying the operating current constraints of the load with time according to the load; and
  comparing the sensed parameters sensed by the parameter sensor to the stored predetermined performance parameters and generating the control signal when the sensed parameters fall outside of the acceptable operating current constraints.

32. The method of claim 31, and further comprising the step of receiving from an input/output communication port new desired relationships for storage in the storage device in the step of storing.

33. The method of claim 31, and further comprising the step of receiving command information over a serial input/output communication link from an external location, which command information is utilized in the step of comparing to override the operation of generating the control signal to generate the control signal in response to receiving the command information.

34. The method of claim 31, wherein the step of sensing the parameters of the circuit breaker includes the step of sensing the level of AC current supplied to the load on the load side of the series breaker element.

35. The method of claim 34, wherein the desired relationship includes a maximum current level, such that whenever the sensed current sensed in the step of sensing exceeds the maximum current level, the step of generating is operable to immediately generate the control signal to interrupt current with the series breaker element.

36. The method of claim 34, and further comprising detecting the current zero crossing to determine when the sensed current makes the transition from a positive to a negative value and goes through a zero value.

37. The method of claim 36, wherein the step of generating the control signal is operable to generate the control signal only when the current is determined to be proximate to a zero value.

38. The method of claim 36, and further comprising the s step of sensing voltage on the load side of the series breaker element and then detecting a voltage zero crossing to determine when the voltage passes from between positive and negative values and at a substantially zero value and also the step of detecting the phase angle between the sensed voltage at the zero crossing point thereof and the sensed current at the zero crossing point thereof.

39. The method of claim 38, and further comprising the step of determining the type of load that is present as a function of the determined phase angle.

40. The method of claim 39, wherein the step of storing is operable to store as the desired relationships a plurality of different, distinct, desired relationships in the storage device and further comprising the step of selecting one of the desired and distinct relationships as a function of the type of determined load after determination thereof by the step of determining.

41. The method of claim 31, wherein the step of storing is operable to store a plurality of predetermined performance parameters, each being distinct and associated with distinct ones of the desired relationships between the current and the load that define distinct, acceptable operating current constraints.

42. The method of claim 41, wherein the plurality of predetermined performance parameters are each selectable as a function of the parameters of the current flow to the load as determined by the step of sensing the current parameters.

43. The method of claim 41, wherein the step of generating the control signal is operable to generate the control signal to cause the series breaker element to discontinue current to the load thereby constituting a trip operation.

44. The method of claim 43, wherein the step of sensing the parameters includes the step of sensing the current flow to the load from the series breaker element and wherein select ones of the plurality of parameters comprise a relationship of current versus time to define trip point constraints as a function of time that are points above which the step of generating the control signal will generate the control signal to trip the series breaker elements, which relationships are defined as trip point profiles.

45. The method of claim 44, wherein each of the trip point profiles are selectable.

* * * * *